(12) United States Patent
Mori

(10) Patent No.: US 10,802,186 B2
(45) Date of Patent: Oct. 13, 2020

(54) STRUCTURE, KIT, AND OPTICAL SENSOR

(71) Applicant: FUJIFILM Corporation, Tokyo (JP)

(72) Inventor: Masahiro Mori, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/540,845

(22) Filed: Aug. 14, 2019

(65) Prior Publication Data

US 2019/0369311 A1 Dec. 5, 2019

Related U.S. Application Data

(63) Continuation of application No. PCT/JP2018/005631, filed on Feb. 19, 2018.

(30) Foreign Application Priority Data

Mar. 9, 2017 (JP) ................. 2017-044531

(51) Int. Cl.
*H04N 9/45* (2006.01)
*G02B 5/20* (2006.01)
(Continued)

(52) U.S. Cl.
CPC .............. *G02B 5/208* (2013.01); *G02B 5/22* (2013.01); *H04N 9/04553* (2018.08); *G01J 1/04* (2013.01); *H01L 27/14649* (2013.01)

(58) Field of Classification Search
CPC ....................................................... G02B 5/22
(Continued)

(56) References Cited

U.S. PATENT DOCUMENTS 3,926,835 A * 12/1975 Tucker ................. C08K 5/0041
252/587
5,902,505 A * 5/1999 Finley ..................... C03C 17/36
219/203

(Continued)

FOREIGN PATENT DOCUMENTS

JP  2006-313974 A  11/2006
JP  2008-21736 A   1/2008
(Continued)

OTHER PUBLICATIONS

Japanese Office Action, dated Mar. 10, 2020, for corresponding Japanese Application No. 2019-504424, with an English translation.
(Continued)

*Primary Examiner* — Leron Beck
(74) *Attorney, Agent, or Firm* — Birch, Stewart, Kolasch & Birch, LLP

(57) ABSTRACT

A structure includes a support and a first near infrared transmitting filter and a second near infrared transmitting filter that are provided at different positions on the support. A minimum value of a transmittance to light having a longer wavelength than longest wavelengths at which transmittances of the first near infrared transmitting filter and the second near infrared transmitting filter in a wavelength range of 600 to 1300 nm are 50% is 50% or higher, and a difference between a wavelength $\lambda_2$ of light having the longest wavelength at which the transmittance of the second near infrared transmitting filter is 50% and a wavelength $\lambda_1$ of light having the longest wavelength at which the transmittance of the first near infrared transmitting filter is 50% is 30 nm or longer.

18 Claims, 3 Drawing Sheets

(51) Int. Cl.
*H04N 9/04* (2006.01)
*G02B 5/22* (2006.01)
*G01J 1/04* (2006.01)
*H01L 27/146* (2006.01)

(58) Field of Classification Search
USPC .......................................................... 348/146
See application file for complete search history.

(56) References Cited

U.S. PATENT DOCUMENTS

| | | | | |
|---|---|---|---|---|
| 5,957,841 | A * | 9/1999 | Maruo | A61B 5/14532 600/316 |
| 6,104,530 | A * | 8/2000 | Okamura | B32B 27/06 359/359 |
| 6,117,370 | A * | 9/2000 | Hasegawa | G02B 5/208 252/587 |
| 6,255,031 | B1 * | 7/2001 | Yao | F21V 7/24 430/270.1 |
| 6,522,463 | B1 * | 2/2003 | Shimomura | G02B 5/208 359/350 |
| 8,630,037 | B1 * | 1/2014 | Osterman | G02B 5/281 359/350 |
| 9,146,157 | B1 * | 9/2015 | Rajavel | G01J 3/36 |
| 10,670,785 | B2 * | 6/2020 | Kim | G02B 5/223 |
| 2001/0005278 | A1 * | 6/2001 | Onomichi | G02B 5/223 359/350 |
| 2004/0137367 | A1 * | 7/2004 | Kitayama | G02B 5/223 430/270.19 |
| 2004/0184173 | A1 * | 9/2004 | Kobayashi | B32B 27/00 359/885 |
| 2008/0007835 | A1 * | 1/2008 | Lim | G02B 5/22 359/602 |
| 2010/0210772 | A1 * | 8/2010 | Hiwatashi | G02B 5/22 524/407 |
| 2010/0220388 | A1 * | 9/2010 | Suzuki | B32B 17/10633 359/359 |
| 2010/0271482 | A1 * | 10/2010 | Otsuki | G02B 5/208 348/148 |
| 2012/0113505 | A1 * | 5/2012 | Chen | G02B 1/115 359/359 |
| 2012/0161090 | A1 * | 6/2012 | Zhu | G02B 1/02 252/587 |
| 2014/0350146 | A1 * | 11/2014 | Tsubouchi | G02B 5/208 524/94 |
| 2015/0146057 | A1 * | 5/2015 | Konishi | G02B 5/208 348/294 |
| 2015/0160386 | A1 * | 6/2015 | Takemura | G02B 5/208 359/359 |
| 2015/0281600 | A1 | 10/2015 | Shigeta | |
| 2016/0139308 | A1 * | 5/2016 | Kim | H01L 27/14625 348/342 |
| 2017/0345860 | A1 | 11/2017 | Nagaya et al. | |
| 2019/0273848 | A1 * | 9/2019 | Satoh | G02B 13/0065 |

FOREIGN PATENT DOCUMENTS

| | | |
|---|---|---|
| JP | 2015-192852 A | 11/2015 |
| JP | 2016-146619 A | 8/2016 |
| WO | WO 2016/088645 A1 | 6/2016 |
| WO | WO 2017/018150 A1 | 2/2017 |

OTHER PUBLICATIONS

International Preliminary Report on Patentability and Written Opinion of the International Searching Authority (Form PCT/IB/326, PCT/IB/373, and PCT/ISA/237) for International Application No. PCT/JP2018/005631, dated Sep. 19, 2019, with English translation of the Written Opinion.

International Search Report (Form PCT/ISA/210) for International Application No. PCT/JP2018/005631, dated May 1, 2018, with English translation.

* cited by examiner

STRUCTURE, KIT, AND OPTICAL SENSOR

CROSS-REFERENCE TO RELATED APPLICATIONS

This application is a Continuation of PCT International Application No. PCT/JP2018/005631 filed on Feb. 19, 2018, which claims priority under 35 U.S.C. § 119(a) to Japanese Patent Application No. 2017-044531 filed on Mar. 9, 2017. Each of the above application(s) is hereby expressly incorporated by reference, in its entirety, into the present application.

BACKGROUND OF THE INVENTION

1. Field of the Invention

The present invention relates to a structure, a kit, and an optical sensor.

2. Description of the Related Art

Near infrared light is less likely to be scattered than visible light due to its longer wavelength and can be used in, for example, distance measurement or three-dimensional measurement. In addition, near infrared light is invisible to persons or animals. Therefore, even in a case where a subject is irradiated with light emitted from a near infrared light source at night, the subject cannot recognize the near infrared light. Thus, near infrared light can be used for imaging a nocturnal wild animal or imaging a subject without provoking the subject for a security reason. This way, an optical sensor that detects near infrared light can be used in various applications and has been investigated in various ways.

For example, JP2016-146619A describes a solid image pickup device including:
- a first optical layer that allows transmission of visible light and at least a part of near infrared light;
- a near infrared pass filter that absorbs at least a part of visible light and allows transmission of at least a part of near infrared light; and
- a pixel array including a first light-receiving element that detects visible light transmitted through the first optical layer and a second light-receiving element that detects near infrared light transmitted through the first optical layer and the near infrared pass filter,
- in which the near infrared pass filter is provided in a portion corresponding to the second light-receiving element,
- in a case where a near infrared light transmittance of the first optical layer in a vertical direction is measured, a wavelength range from a shortest wavelength (X1) where the transmittance is 30% or higher to a longest wavelength (X2) where the transmittance is 30% or lower is represented by X, and
- a product of an average transmittance of the first optical layer in the wavelength range (X) measured in the vertical direction of near infrared light and an average transmittance of the near infrared pass filter in the wavelength range (X) measured in the vertical direction of near infrared light is 30% or higher.

In addition, JP2015-192852A describes an imaging device including:
- an imaging unit that includes a plurality of pixels arranged in a two-dimensional matrix,
- in which the plurality of pixels include a first pixel and a second pixel,
- a light receiving sensitivity of the first pixel has a maximum value in the vicinity of each of a first wavelength and a second wavelength that are different from each other in a near infrared wavelength range,
- a light receiving sensitivity of the second pixel has a maximum value in the vicinity of the second wavelength, and
- a light receiving sensitivity of the second pixel at the first wavelength is 10% or lower of a light receiving sensitivity of the first pixel at the first wavelength.

SUMMARY OF THE INVENTION

Near infrared light is likely to include noise generated from visible light or the like. Therefore, in order to improve the sensing accuracy of an optical sensor, it is desirable to increase a signal-to-noise ratio (S/N ratio) of desired light for detection. In addition, even in the optical sensors described in JP2016-146619A and JP2015-192852A, it is difficult to sufficiently reduce noise from desired light.

Accordingly, an object of the present invention is to provide a structure that can detect light with reduced noise with high sensitivity. In addition, another object of the present invention is to provide a kit that is used for manufacturing the above-described structure and an optical sensor including the above-described structure.

According to the investigation, the present inventors found that light with reduced noise can be detected with high sensitivity by using a structure described below, thereby completing the present invention. Accordingly, the present invention provides the following.

<1> A structure comprising:
- a support;
- a first near infrared transmitting filter and a second near infrared transmitting filter that are provided at different positions on the support and allow transmission of at least a part of near infrared light,
- wherein the first near infrared transmitting filter shields at least a part of visible light,
- the second near infrared transmitting filter shields light up to a longer wavelength than a wavelength of the light shielded by the first near infrared transmitting filter,
- a minimum value, of a transmittance to light having a longer wavelength than longest wavelengths at which transmittances of the first near infrared transmitting filter and the second near infrared transmitting filter in a wavelength range of 600 to 1300 nm are 50% is 50% or higher, and
- a difference between a wavelength $\lambda_2$ of light having the longest wavelength at which the transmittance of the second near infrared transmitting filter is 50% and a wavelength $\lambda_1$ of light having the longest wavelength at which the transmittance of the first near infrared transmitting filter in a wavelength range of 600 to 1300 nm is 50% is 30 nm or longer.

<2> The structure according to <1>, further comprising:
- at least one of a color filter or a near infrared cut filter that is provided at a position different from the positions where the first near infrared transmitting filter and the second near infrared transmitting filter are provided on the support.

<3> The structure according to <1> or <2>, further comprising:
- a band pass filter that is provided on an optical path of at least One of the first near infrared transmitting filter or the second near infrared transmitting filter and allows transmission of a part of near infrared light.

<4> The structure according to <3>,
wherein the band pass filter is a filter that allows transmission of light in a wavelength range of the wavelength $\lambda_1$ to the wavelength $\lambda_2+50$ nm.
<5> The structure according to <3> or <4>,
in which the band pass filter is a filter that allows transmission of light in a wavelength range of 400 to 620 nm and light in a wavelength range of the wavelength $\lambda_1$ to the wavelength $\lambda_2+50$ nm.
<6> A kit that is used for forming the first near infrared transmitting filter and the second near infrared transmitting filter in the structure according to any one of <1> to <5>, the kit comprising:
a first near infrared transmitting filler-forming composition that includes a light shielding material and a curable compound; and
a second near infrared transmitting filter-forming composition that includes a light shielding material and a curable compound.
<7> An optical sensor comprising:
the structure according to any one of <1> to <5>.
<8> The optical sensor according to <7>, further comprising:
a light source that emits two or more light components having different wavelengths.
<9> The optical sensor according to <7> or <8>, further comprising: two or more light sources,
wherein light components having different wavelengths are emitted from the respective light sources.
<10> The optical sensor according to <8> or <9>,
in which the light components having different wavelength includes at least light having a wavelength at which transmittances of the first near infrared transmitting filter and the second near infrared transmitting filter in the structure are 50% or higher and light having a wavelength at which a transmittance of the first near infrared transmitting filter is 50% or higher and a transmittance of the second near infrared transmitting filter is 20% or lower.

According to the present invention, a structure that can detect light with reduced noise with high sensitivity, a kit that is used for manufacturing the above-described structure, and an optical sensor including the above-described structure can be provided.

DESCRIPTION OF THE PREFERRED EMBODIMENTS

Figure 1:
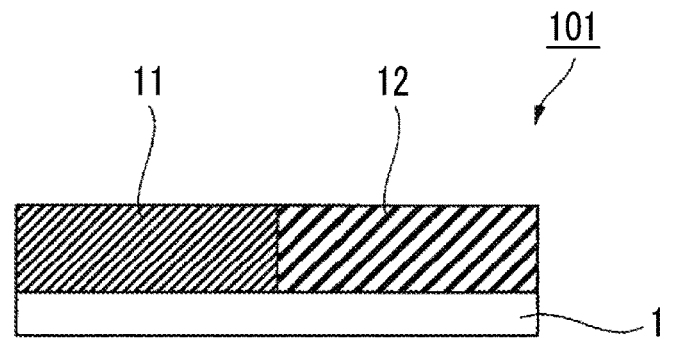
FIG. 1 is a schematic diagram illustrating one embodiment of a structure according to the present invention.

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)allyl group" denotes either or both of allyl and methallyl, "(meth)acrylate" denotes either or both of acrylate or methacrylate, "(meth)acryl" denotes either or both of acryl and methacryl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC). In this specification, an weight-average molecular weight (Mw) and a number-average molecular weight (Mn) can be obtained by using HCL-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

In this specification, "near infrared light" denotes light (electromagnetic wave) in a wavelength range of 700 to 2500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Structure>

A structure according to an embodiment of the present invention comprises:
a support; and a first near infrared transmitting filter and a second near infrared transmitting filter,
in which the first near infrared transmitting filter shields at least a part of visible light and allows transmission of at least a part of near infrared light,
the second near infrared transmitting filter shields light up to a longer wavelength than a wavelength of the light shielded by the first near infrared transmitting filter and allows transmission of at least a part of near infrared light,
a minimum value of a transmittance to light having a longer wavelength than longest wavelengths at which transmittances of the first near infrared transmitting filter and the second near infrared transmitting filter in a wavelength range of 600 to 1300 nm are 50% is 50% or higher, and a difference between a wavelength $\lambda_2$ of light having the longest wavelength at which the transmittance of the second near infrared transmitting filter is 50% and a wavelength $\lambda_1$ of light having the longest wavelength at which the transmittance of the first near infrared transmitting filter is 50% in a wavelength range of 600 to 1300 nm is 30 nm or longer. In other words, in a wavelength range of 600 to 1300 nm, each of the first near infrared transmitting filter and the second near infrared transmitting filter allows transmission of 50% or higher of light having a longer wavelength than a longest wavelength at which a transmittance is 50%. In addition, the first near infrared transmitting filter and the second near infrared transmitting filter satisfy a relationship in which a difference ($\lambda_2$-$\lambda_1$) between a wavelength $\lambda_2$ of light having the longest wavelength at which the transmittance of the second near infrared transmitting filter is 50% and a wavelength $\lambda_1$ of light having the longest wavelength at which the transmittance of the first near infrared transmitting filter is 50% is 30 nm or longer.

In the structure according to the embodiment of the present invention, the first near infrared transmitting filter and the second near infrared transmitting filter are provided at different positions on the support. As a result, noise with reduced noise can be detected with high sensitivity by correcting light transmitted through the second near infrared transmitting filter using light transmitted through the first near infrared transmitting filter and performing a process such as noise subtraction. In addition, near infrared light components having different wavelengths can be simultaneously detected using the respective near infrared transmitting filters, and multiple sensing or the like can be performed.

In the structure according to the embodiment of the present invention, the support is not particularly limited, and can be appropriately selected according to the use. Examples of the support include a substrate formed of a material such as silicon, non-alkali glass, soda glass, PYREX (registered trade name) glass, or quartz glass. In addition, for example, an InGaAs substrate is preferably used. The InGaAs substrate has excellent sensitivity to light having a wavelength of longer than 1000 nm. Therefore, by forming the respective near infrared transmitting filters on the InGaAs substrate, an optical sensor having excellent sensitivity to light having a wavelength of longer than 1000 nm is likely to be obtained. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat.

In the structure according to the embodiment of the present invention, as the second near infrared transmitting filter, one kind may be used, or two or more kinds may be used. For example, in a case where two or more second near infrared transmitting filters are used, it is preferable that one second near infrared transmitting filter (hereinafter, also referred to as "second near infrared transmitting filter B") is a filter having spectral characteristics in which light having a longer wavelength than that of light shielded by the other second near infrared transmitting filter (hereinafter, also referred to as "second near infrared transmitting filter A") is shielded and transmission of at least a part of near infrared light is allowed. In addition, in a case where three or more second near infrared transmitting filters are used, in addition to the second near infrared transmitting filter A and the second near infrared transmitting filter B, it is preferable to further provide a second near infrared transmitting filter (second near infrared transmitting filter C) having spectral characteristics in which light having a longer wavelength than that of light shielded by the second near infrared transmitting filter B is shielded and transmission of at least a part of near infrared light is allowed. The same can also be applied to a case where four or more second near infrared transmitting filters are used.

In the structure according to the embodiment of the present invention, the proportions of the areas of the first near infrared transmitting filter and the second near infrared transmitting filter may be the same as or different from each other. However, an image sensor such as a silicon photodiode tends to have low sensitivity to light having a longer wavelength side than a near infrared range. Therefore, in a case where the proportion of the area of the second near infrared transmitting filter is higher than that of the first near infrared transmitting filter, high sensitivity to light having a longer wavelength side than a near infrared range can be obtained. Further, light with reduced noise is likely to be detected.

In the structure according to the embodiment of the present invention, a minimum value of a transmittance to light having a longer wavelength than longest wavelengths at which transmittances of the first near infrared transmitting filter and the second near infrared transmitting filter in a wavelength range of 600 to 1300 nm are 50% is 50% or higher, preferably 60% or higher, and still more preferably 70% or higher. In a case where the minimum value of the transmittance is 50% or higher, noise can be effectively removed from desired light. In addition, in a wavelength range of 600 to 1300 nm, a difference ($\lambda_2$-$\lambda_1$) between a wavelength $\lambda_2$ of light having the longest wavelength at which the transmittance of the second near infrared transmitting filter is 50% and a wavelength $\lambda_1$ of light having the longest wavelength at which the transmittance of the first near infrared transmitting filter is 50% is 30 nm or longer, preferably 50 nm or longer, and more preferably 70 nm or longer. The upper limit is preferably 300 nm or shorter and more preferably 250 nm or shorter. In a case where the difference ($\lambda_2$-$\lambda_1$) between the wavelengths is 30 nm or longer, noise can be effectively removed from desired light. In addition, the wavelength $\lambda_1$ and the wavelength $\lambda_2$ are present preferably in a wavelength range of 600 to 1200 nm and more preferably in a range of 650 to 1100 nm.

The thickness of the near infrared transmitting filter is not particularly limited. For example, the thickness is preferably 100 μm or less, more preferably 15 μm or less, still more preferably 5 μm or less, and still more preferably 1 μm or less. For example, the lower limit value is preferably 0.1 μm or more, more preferably 0.2 μm or more, and still more preferably 0.3 μm or more. In addition, the thicknesses of the respective near infrared transmitting filters (for example, the thicknesses of the first near infrared transmitting filter and the second near infrared transmitting filter; in a case where a plurality of second near infrared transmitting filters are used, the thicknesses of the plurality of second near infrared transmitting filters) may be the same as or different from each other.

In the structure according to the embodiment of the present invention, the near infrared transmitting filter is not particularly limited as long as it is a filter having spectral characteristics in which at least a part of visible light is shielded and transmission of at least a part of near infrared light is allowed. In addition, the near infrared transmitting filter may be configured as one-layer film (single-layer film) or as a laminate (multi-layer film) including two or more films. In addition, in a ease where the near infrared transmitting filter is configured as a multi-layer film, the multi-layer film as a whole may have the above-described spectral characteristics or each of the single-layer films may not have the above-described spectral characteristics. Preferable examples of the near infrared transmitting filter include filters having any one of the following spectral characteristics (1) to (4).

(1): an aspect in which a maximum value of a light transmittance in a thickness direction in a wavelength range of 400 to 640 nm is 20% or lower (preferably 15% or lower and more preferably 10% or lower), and a minimum value of a light transmittance in the thickness direction in a wavelength range of 800 to 1300 nm is 70% or higher (preferably 75% or higher and more preferably 80% or higher). According to this aspect, a filter that shields light in a wavelength range of 400 to 640 nm and allows transmission of light having a wavelength of longer than 670 nm can be formed.

(2): an aspect in which a maximum value of a light transmittance in a thickness direction in a wavelength range of 400 to 750 nm is 20% or lower (preferably 15% or lower and more preferably 10% or lower), and a minimum value of a light transmittance in the thickness direction in a wavelength range of 900 to 1300 nm is 70% or higher (preferably 75% or higher and more preferably 80% or higher). According to this aspect, a filter that shields light in a wavelength range of 400 to 750 nm and allows transmission of light having a wavelength of longer than 800 nm can be formed.

(3): an aspect in which a maximum value of a light transmittance in a thickness direction in a wavelength range of 400 to 830 nm is 20% or lower (preferably 15% or lower and more preferably 10% or lower), and a minimum value of a light transmittance in the thickness direction in a wavelength range of 1000 to 1300 nm is 70% or higher (preferably 75% or higher and more preferably 80% or higher). According to this aspect, a filter that shields light in a wavelength range of 400 to 830 nm and allows transmission of light having a wavelength of longer than 900 nm can be formed.

(4): an aspect in which a maximum value of a light transmittance in a thickness direction in a wavelength range of 400 to 950 nm is 20% or lower (preferably 15% or lower and more preferably 10% or lower), and a minimum value of a light transmittance in the thickness direction in a wavelength range of 1100 to 1300 nm is 70% or higher (preferably 75% or higher and more preferably 80% or higher). According to this aspect, a filter that shields light in a wavelength range of 400 to 950 nm and allows transmission of light having a wavelength of longer than 1000 nm can be formed.

In this specification, a maximum value of a light transmittance in a specific wavelength range being 20% or lower represents that light in the specific wavelength range is shielded.

Examples of a preferable combination of the first near infrared transmitting filter and the second near infrared transmitting filter include the following combinations. In particular, a combination of (2) and (3) described above is preferable because iris can be clearly recognized by using 810 to 820 nm for iris recognition and noise generated from sunlight is small by using light having a wavelength of about 940 nm for distance recognition such that the accuracy of distance recognition is excellent.

(A): a combination of a filter having the spectral characteristics (1) and at least one of filters having any one of the spectral characteristics (2) to (4)

(B): a combination of a filter having the spectral characteristics (2) and at least one of filters having any one of the spectral characteristics (3) or (4)

(C): a combination of a filter having the spectral characteristics (3) and a filter having the spectral characteristics (4)

The structure according to any one of the present invention may include another near infrared transmitting filter other than the first near infrared transmitting filter and the second near infrared transmitting filter. Examples of the other near infrared transmitting filter include a near infrared transmitting filter that shields light up to a longer wavelength than a wavelength of the light shielded by the first near infrared transmitting filter and allows transmission of at least a part of near infrared light, in which a minimum value of a transmittance to light having a longer wavelength than a longest wavelength $\lambda_3$ at which a transmittance in a wavelength range of 600 to 1300 nm is 50% is 50% or higher, and a difference between the wavelength $\lambda_3$ and the wavelength $\lambda_1$ of light having the longest wavelength at which the transmittance of the first near infrared transmitting filter is 50% is shorter than 30 nm.

The structure according to the embodiment of the present invention may include at least one selected from a color filter or a near infrared cut filter that is provided at a position different from the positions where the first near infrared transmitting filter and the second near infrared transmitting filter are provided on the support. In a case where the structure according to the embodiment of the present invention further includes the color filter, not only sensing or image recognition using near infrared light but also image recognition using a color image can be simultaneously performed. Further, a clearer color image can be obtained by subtracting noise generated from near infrared light to the color filter. In addition, in a case where the structure according to the embodiment of the present invention further includes the near infrared cut filter, information regarding the brightness of visible light can be selectively obtained, and three-dimensional recognition can be performed. In the present invention, the near infrared cut filter refers to a filter that allows transmission of visible light and shields at least a part of near infrared light. The near infrared cut filter may be a filter that allows transmission of light in the entire wavelength range of the visible range, or may be a filter that allows transmission of light in a specific wavelength range of the visible range and shields light in another specific wavelength range of the visible range. The near infrared cut filter is formed using a composition including a near infrared absorber. In addition, in the present invention, a color filter refers to a filter that allows transmission of light in a specific wavelength range of the visible range and shields light in another specific wavelength range of the visible range. The color filter may have spectral characteristics in which at least a part of near infrared light is shielded. The color filter having spectral characteristics in which at least a part of near infrared light is shielded can be formed using a composition including a chromatic colorant and a near infrared absorber.

Examples of the color filter include a color filter including one or more colored layers selected from a red colored layer, a cyan colored layer, a magenta colored layer, or a yellow colored layer. The color filter may be configured with a single colored layer or may include two or more colored layers. The thickness of the color filter (colored layer) is not particularly limited. For example, the thickness is preferably 100 μm or less, more preferably 15 μm or less, still more preferably 5 μm or less, and still more preferably 1 μm or less. For example, the lower limit value is preferably 0.1 μm or more, more preferably 0.2 μm or more, and still more preferably 0.3 μm or more.

The maximum absorption wavelength of the near infrared cut filter is present preferably in a wavelength range of 700 to 2000 nm, more preferably in a wavelength range of 700 to 1300 nm, and still more preferably in a wavelength range of 700 to 1000 nm. In addition, a ratio absorbance Amax/absorbance A550 of an absorbance Amax at the maximum absorption wavelength to an absorbance A550 at a wavelength of 550 nm is preferably 50 to 500, more preferably 70 to 450, and still more preferably 100 to 400. The near infrared cut filter may be configured with one-layer film (single-layer film) or with a laminate (multi-layer film) including two or more films.

It is preferable that the near infrared cut filter satisfies at least one of the following conditions (1) to (4), it is more preferable that the near infrared cut filter satisfies all the following conditions (1) to (4).
  (1) A light transmittance at a wavelength of 400 nm is preferably 70% or higher, more preferably 80% or higher, still more preferably 85% or higher, and still more preferably 90% or higher
  (2) A light transmittance at a wavelength of 500 nm is preferably 70% or higher, more preferably 80% or higher, still more preferably 90% or higher, and still more preferably 95% or higher
  (3) A light transmittance at a wavelength of 600 nm is preferably 70% or higher, more preferably 80% or higher, still more preferably 90% or higher, and still more preferably 95% or higher
  (4) A light transmittance at a wavelength of 650 nm is preferably 70% or higher, more preferably 80% or higher, still more preferably 90% or higher, and still more preferably 95% or higher A light transmittance of the near infrared cut filter in a wavelength range of 400 to 650 nm is preferably 70% or higher, more preferably 80% or higher, and still more preferably 90% or higher. In addition, a transmittance at at least one point in a wavelength range of 700 to 1000 nm is preferably 20% or lower.

The thickness of the near infrared cut filter is not particularly limited. For example, the thickness is preferably 100 μm or less, more preferably 15 μm or less, still more preferably 5 μm or less, and still more preferably 1 μm or less. For example, the lower limit value is preferably 0.1 μm or more, more preferably 0.2 μm or more, and still more preferably 0.3 μm or more.

In a case where the structure according to the embodiment of the present invention includes the near infrared cut filter that is provided at a position different from the positions where the first near infrared transmitting filter and the second near infrared transmitting filter are provided on the support, as the near infrared cut filter, only one kind may be used alone, and two or more kinds may be used. In a case where two or more near infrared cut filters are used, a difference, between the maximum absorption wavelengths of the near infrared cut filters can be appropriately selected according to the use. For example, the difference is preferably 30 to 300 nm. The upper limit is preferably 270 nm or shorter and more preferably 250 nm or shorter. The lower limit is preferably 40 nm or longer, and more preferably 50 nm or longer.

It is preferable that the structure according to the embodiment of the present invention further includes a near infrared cut filter that is provided on an optical path of at least one of the first near infrared transmitting filter or the second near infrared transmitting filter. According to this aspect, noise other than light that is desired to be detected by the near infrared transmitting filter can be more effectively removed. For example, a near infrared cut filter having spectral characteristics in which a transmittance to light having a wavelength $\lambda_A$ described below emitted from a light source such as an optical sensor is 70% or higher and a transmittance to light having a wavelength $\lambda_B$ described below is 20% or lower is provided on an optical path of the first near infrared transmitting filter such that only information regarding the light having the wavelength $\lambda_A$ can be selectively acquired by a first filter.

In addition, a near infrared cut filter having spectral characteristics in which a transmittance to the light having the wavelength $\lambda_B$ described below is 70% or higher and a transmittance to light having the wavelength $\lambda_B+50$ nm is 20% or lower is provided on an optical path of the second near infrared transmitting filter such that noise of near infrared light generated by ambient light can be more effectively removed.

In a case where the structure according to the embodiment of the present invention includes the color filter that is provided at a position different from the positions where the first near infrared transmitting filter and the second near infrared transmitting filter are provided on the support, it is also preferable that the near infrared cut filter is further provided on an optical path of the color filter. According to this aspect, visible light with reduced noise can be detected.

It is also preferable that the structure according to the embodiment of the present invention further includes a band pass filter that is provided on an optical path of at least one of the first near infrared transmitting filter or the second near infrared transmitting filter and allows transmission of a part of near infrared light. According to this aspect, light with further reduced noise can be detected with high sensitivity. It is preferable that the band pass filter is a filter having spectral characteristics in which transmission of light in a wavelength range of the wavelength $\lambda_1$ to the wavelength $\lambda_2+50$ nm is allowed. Examples of the band pass filter include a laminate in which a high refractive index layer and a low refractive index layer are alternately laminated.

The band pass filter may be a filter that shields visible light or a filter that allows transmission of visible light. The spectral characteristics of the visible range of the band pass filter can be appropriately selected according to the use. For example, in a case where the structure according to the embodiment of the present invention does not include the color filter that is provided at a position different from the positions where the first near infrared transmitting filter and the second near infrared transmitting filter are provided on the support, or in a case where the structure according to the embodiment of the present invention includes the color filter that is provided at a position different from the positions where the first near infrared transmitting filter and the second near infrared transmitting filter are provided on the support but the structure does not include the band pass filter on an optical path of the color filter, it is preferable that the band pass filter is a filter that shields visible light. By using this band pass filter, desired light such as near infrared light with reduced noise can be detected with high sensitivity. In addition, in a case where the structure according to the embodiment of the present invention includes the first near infrared transmitting filter, the second near infrared transmitting filter, and the color filter at different positions on the support and includes the band pass filter on an optical path of the color filter, the band pass filter is preferably a filter that allows transmission of visible light and more preferably is a filter having spectral characteristics in which transmission of light in a wavelength range of 400 to 620 nm and light in a wavelength range of the wavelength $\lambda_1$ to the wavelength $\lambda_2+50$ nm are allowed. According to this aspect, visible light with reduced noise and near infrared light can be simultaneously detected with high sensitivity.

In the structure according to the embodiment of the present invention, it is preferable that differences in height between upper surfaces of filters adjacent to each other are substantially the same from the viewpoint of, for example, improving resolution by controlling adhesiveness, flatness, and incidence angle.

The structure according to the embodiment of the present invention can be used in a state where it is incorporated into various optical sensors such as a solid image pickup element or an image display device (for example, a liquid crystal display device or an organic electroluminescence (organic EL) display device). For example, an optical sensor into which the structure according to the embodiment of the present invention is embedded can be preferably used for applications, for example, for iris recognition, for distance measurement, for a proximity sensor, for a gesture sensor, for a motion sensor; a Time-of-Flight (TOF) sensor, for a vein sensor, for blood vessel visualization, for sebum amount measurement, for fluorescent labeling, or for a surveillance camera.

Hereinafter, one embodiment of the structure according to the present invention will be described in more detail using the drawings.

In FIGS. 1 to 8, respective filters are directly provided, on the support. However, an adhesion layer such as an undercoat layer may be provided between each of the filters and the support. In addition, in FIGS. 5 to 8, a transparent layer such as a planarizing film may be provided between the filters that are vertically laminated. As the transparent layer, a layer formed of a material constituting each of the filters excluding a colorant component can be suitably used. In addition, in FIGS. 1 to 8, differences in height between the upper surfaces of the filters adjacent to each other are substantially the same. However, the differences in height between the upper surfaces of the filters adjacent to each other may be different from each other. In addition, in a case where the differences in height between the upper surfaces of the filters adjacent to each other are different from each other, it is preferable that the differences in height are filled with the transparent layer or the like.

FIG. 1 illustrates a structure 101 according to one embodiment of the structure according to the present invention in which a first near infrared transmitting filter 11 and a second near infrared transmitting filter 12 are arranged at different positions on a support 1. The first near infrared transmitting filter and the second near infrared transmitting filter are filters having the above-described spectral characteristics. In FIG. 1, only one second near infrared transmitting filter 12 is provided. However, two or more second near infrared transmitting filters having different spectral characteristics may be arranged at different positions on the support 1. In addition, the above-described other near infrared transmitting filter may be arranged on the support. In addition, in FIG. 1, the thicknesses of the first near infrared transmitting filter 11 and the second near infrared transmitting filter 12 are the same. However, the thicknesses may be different from each other.

Figure 2:
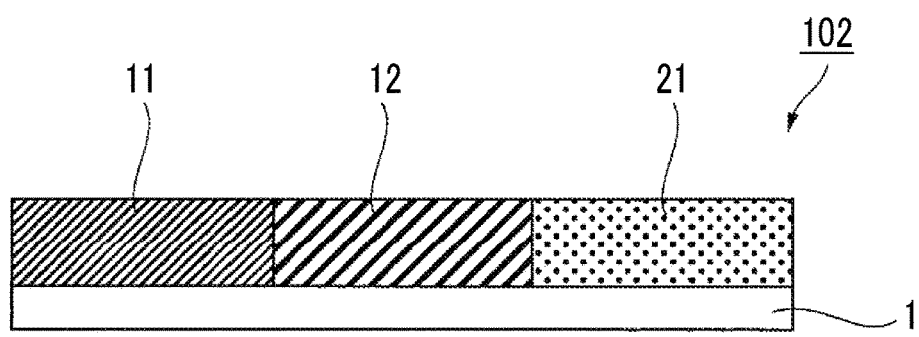
FIG. 2 is a schematic diagram illustrating another embodiment of a structure according to the present invention.

FIG. 2 illustrates a structure 102 according to another embodiment of the structure according to the present invention in which the first near infrared transmitting filter 11, the second near infrared transmitting filter 12, and a near infrared cut filter 21 are arranged at different positions on the support 1. Examples of the near infrared cut filter 21 include a filter having spectral characteristics in which a transmittance to light having the wavelength $\lambda_A$ described below is 20% or lower and a transmittance to light having the wavelength $\lambda_B$ described below is 60% or higher and a filter having spectral characteristics in which a transmittance to light having the wavelength $\lambda_A$ described below is 20% or lower and a transmittance to light having the wavelength $\lambda_B$ described below is 20% or higher. In FIG. 2, only one second near infrared cut filter 21 is provided. However, two or more second near infrared cut filters having different spectral characteristics may be arranged at different positions on the support 1. In addition, in FIG. 2, the near infrared cut filter is a single-layer film. However, a laminate in which a plurality of near infrared cut filters having different spectral characteristics are laminated may be used. In addition, in FIG. 2, the thicknesses of the first near infrared transmitting filter 11, the second near infrared transmitting filter 12, and the near infrared cut filter 21 are the same. However, the thicknesses may be different from each other.

Figure 3:
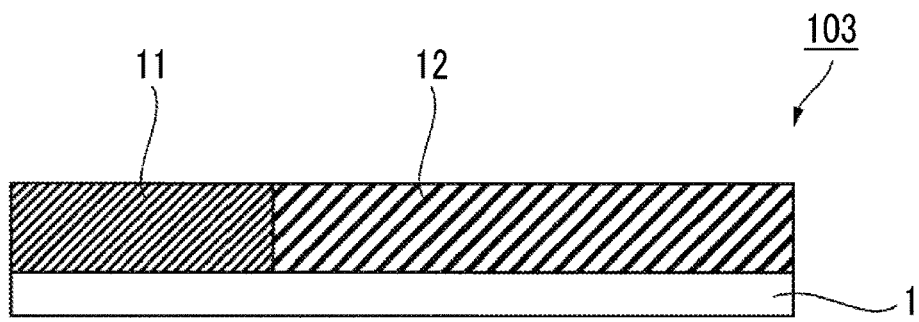
FIG. 3 is a schematic diagram illustrating still another embodiment of a structure according to the present invention.

FIG. 3 illustrates a structure 103 according to still another embodiment of the structure according to the present invention in which a first near infrared transmitting filter 11 and a second near infrared transmitting filter 12 are arranged at different positions on a support 1. In FIG. 3, the proportion of the area of the second near infrared transmitting filter 12 in the support 1 is higher than that of the first near infrared transmitting filter. In FIG. 3, only one second near infrared transmitting filter 12 is provided. However, two or more second near infrared transmitting filters having different spectral characteristics may be arranged at different positions on the support 1. In addition, in FIG. 3, the thicknesses of the first near infrared transmitting filter 11 and the second near infrared transmitting filter 12 are the same. However, the thicknesses may be different from each other.

Figure 4:
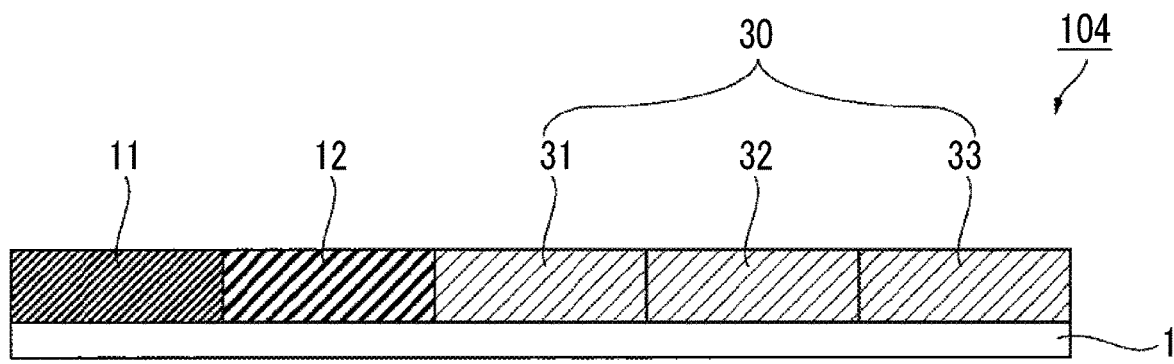
FIG. 4 is a schematic diagram illustrating still another embodiment of a structure according to the present invention.

FIG. 4 illustrates a structure 104 according to still another embodiment of the structure according to the present invention in which, the first near infrared transmitting filter 11, the second near infrared transmitting filter 12, and a color filter 30 are formed at different positions on the support 1. In FIG. 4, the color filter 30 includes a red colored layer 31, a blue colored layer 32, and a green colored layer 33. In FIG. 4, the color filter 30 includes the red colored layer 31, the blue colored layer 32, and the green colored layer 33. However, the color filter 30 may further include a colored layer (for example, yellow, magenta, or cyan) other than the above-described colors or may further include a transparent layer. In addition, the color filter 30 may further include colored layer of other colors instead of the above-described colors. For example, the color filter 30 may include a yellow colored layer, a magenta colored layer, and a cyan colored layer. In addition, the color filter 30 may consist of only a single colored layer. In addition, in FIG. 4, the thicknesses of the first near infrared transmitting filter 11, the second near infrared transmitting filter 12, and the color filter 30 are the same. However, the thicknesses may be different from each other. In FIG. 4, Only one second near infrared transmitting filter 12 is provided. However, two or more second near infrared transmitting filters having different spectral characteristics may be arranged at different positions on the support 1.

Figure 5:
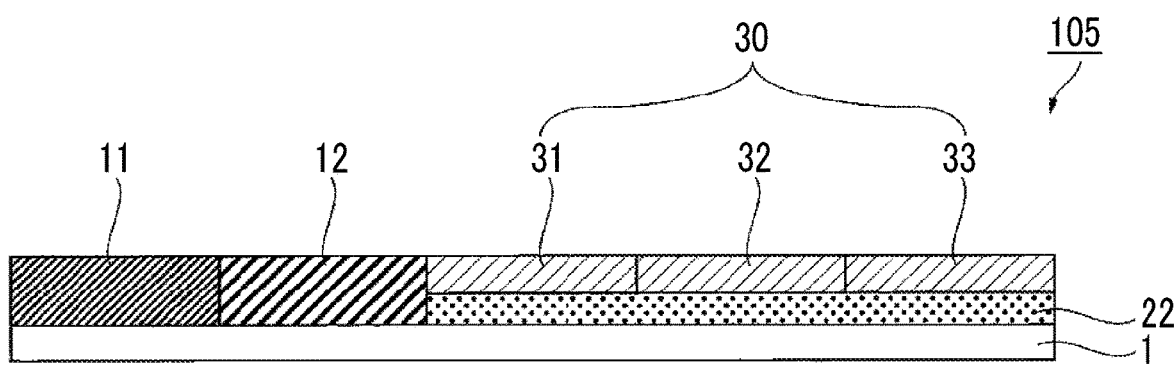
FIG. 5 is a schematic diagram illustrating still another embodiment of a structure according to the present invention.

FIG. 5 illustrates a structure 105 according to still another embodiment of the structure according to the present invention in which the first near infrared transmitting filter 11, the second near infrared transmitting filter 12, and a near infrared cut filter 22 are formed at different positions on the support 1. The color filter 30 is formed on the near infrared cut filter 22. In FIG. 5, the color filter 30 includes the red colored layer 31, the blue colored layer 32, and the green colored layer 33. Regarding the color filter 30, the aspect described above using FIG. 4 can be adopted. In addition, in FIG. 5, the laminating order of the near infrared cut filter 22 and the color filter 30 may be switched.

Figure 6:
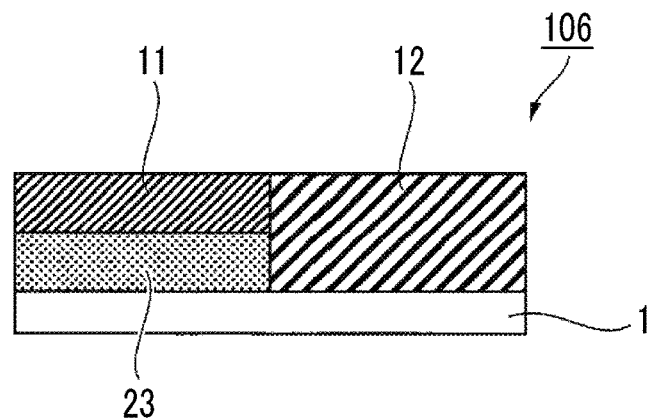
FIG. 6 is a schematic diagram illustrating still another embodiment of a structure according to the present invention.

FIG. 6 illustrates a structure 106 according to still another embodiment of the structure according to the present invention in which a laminate including the hear infrared cut filter 23 and the first near infrared transmitting filter 11 and the second near infrared transmitting filter 12 are formed at different positions on the support 1. For example, it is preferable that the near infrared cut filter 23 is a near infrared cut filter having spectral characteristics in which a transmittance to light having the wavelength $\lambda_A$ described below is 70% or higher and a transmittance to light having the wavelength $\lambda_B$ described below is 20% or lower. In FIG. 6, the near infrared cut filter 23 and the first near infrared transmitting filter 11 are formed on the support 1 in this order. However, the first near infrared transmitting filter Il and the near infrared cut filter 23 may be formed on the support in this order.

In addition, in FIG. 6, another near infrared cut filter may also be arranged on a surface of the second near infrared transmitting filter 12 or between the second near infrared transmitting filter 12 and the support 1. In addition, a near infrared cut filter may be provided only on a surface of the second near infrared transmitting filter 12 or between the second near infrared transmitting filter 12 and the support 1. It is preferable that this near infrared cut filter has spectral characteristics in which a transmittance to light having the wavelength $\lambda_B$ described below is 70% or higher and a transmittance to light having the wavelength $\lambda_B+50$ nm is 20% or lower.

Figure 7:
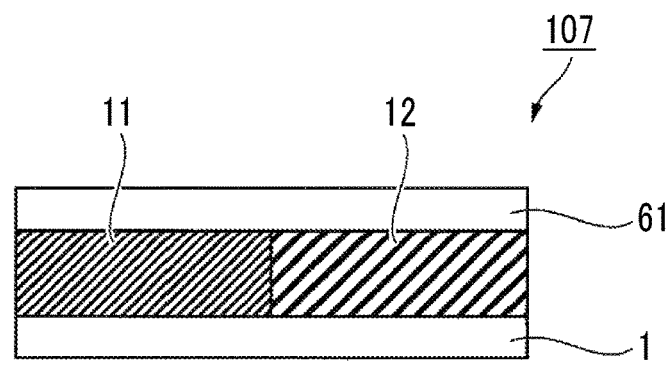
FIG. 7 is a schematic diagram illustrating still another embodiment of a structure according to the present invention.

FIG. 7 illustrates a structure 107 according to still another embodiment of the structure according to the present invention in which the first near infrared transmitting filter 11 and the second near infrared transmitting filter 12 are formed at different positions on a support 1. In addition, a band pass filter 61 that allows transmission of a part of near infrared light is formed on the first near infrared transmitting filter 11 and the second near infrared transmitting filter 12. It is preferable that the band pass filter 61 is a filter having spectral characteristics in which transmission of light in a wavelength range of the wavelength $\lambda_1$ to the wavelength $\lambda_2+50$ nm is allowed. In FIG. 7, the band pass filter 61 is preferably a filter having spectral characteristics in which visible light is shielded and more preferably a filter that shields light in a wavelength range of 400 to 620 nm. In FIG. 7, only one second near infrared transmitting filter 12 is provided. However, two or mote second near infrared transmitting filters having different spectral characteristics may be arranged at different positions on the support 1. In addition, in FIG. 7, the thicknesses of the first near infrared transmitting filter 11 and the second near infrared transmitting filter 12 are the same. However, the thicknesses may be different from each other. In addition, in FIG. 7, the band pass filter 61 is provided on the first near infrared transmitting filter 11 and the second near infrared transmitting filter 12, but the laminating order thereof may be switched. In addition, a transparent layer such as a planarizing film or another member constituting an optical sensor may be provided between the first near infrared transmitting filter 11 and the second near infrared transmitting filter 12 and the band pass filter 61. In addition, in FIG. 7, as illustrated in FIG. 6, the laminate including the first near infrared transmitting filter 11 and the near infrared cut filter 23 may be formed on the support 1.

Figure 8:
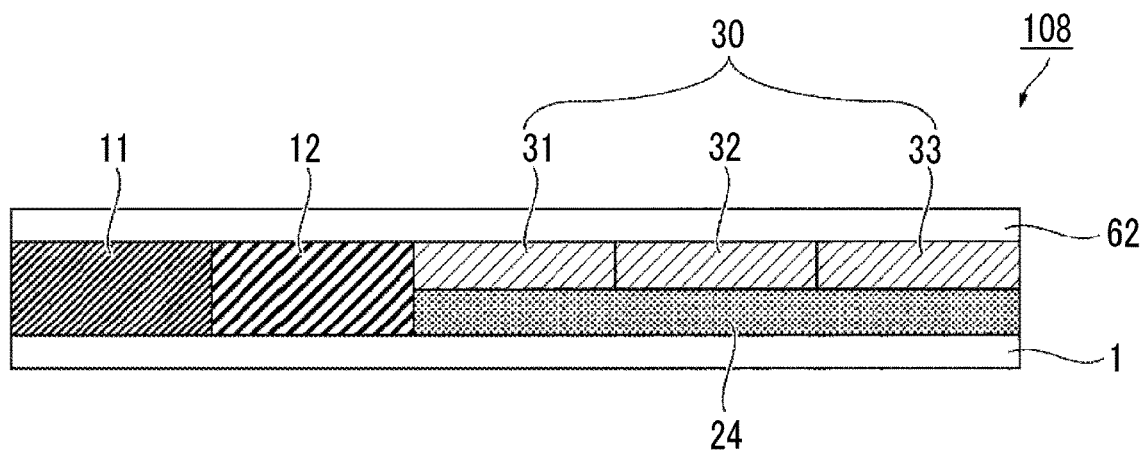
FIG. 8 is a schematic diagram illustrating still another embodiment of a structure according to the present invention.

FIG. 8 illustrates a structure 108 according to still another embodiment of the structure according to the present invention in which the first near infrared transmitting filter 11, the second near infrared transmitting filter 12, and a near infrared cut filter 23 are formed at different positions on the support 1. The color filter 30 is formed on the near infrared cut filter 23. In FIG. 8, the color filter 30 includes the red colored layer 31, the blue colored layer 32, and the green colored layer 33. A band pass filter 62 is provided on the first near infrared transmitting filter 11, the second near infrared transmitting filter 12, and the color filter 30. The band pass filter 62 is a filter that allows transmission of a part of near infrared light and allows transmission of visible light. It is more preferable that the band pass filter 62 is a filter having spectral characteristics in which transmission of light in a wavelength range of 400 to 620 nm and light in a wavelength range of the wavelength $\lambda_1$ to the wavelength $\lambda_2+50$ nm is allowed.

In FIG. 8, the color filter 30 includes the red colored layer 31, the blue colored layer 32, and the green colored layer 33. Regarding the color filter 30, the aspect described above using FIG. 4 can be adopted. In addition, in FIG. 8, the laminating order of the near infrared cut filter 23 and the color filter 30 may be switched. In addition, in FIG. 8, only one second near infrared transmitting filter 12 is provided. However, two or more second near infrared transmitting filters having different spectral characteristics may be arranged at different positions on the support 1. In addition, in FIG. 8, the thicknesses of the first near infrared transmitting filter 11 and the second near infrared transmitting filter 12 are the same. However, the thicknesses may be different from each other. In addition, in FIG. 8, the band pass filter 62 is provided on the first near infrared transmitting filter 11, the second near infrared transmitting filter 12, and the color filter 30 but the laminating order thereof may be switched. In addition, a transparent layer such as a planarizing film or another member constituting an optical sensor may be provided between the first near infrared transmitting filter 11, the second near infrared transmitting filter 12, and the color filter 30 and the band pass filter 62. In addition, in FIG. 8, as illustrated in FIG. 6, the laminate including the first near infrared transmitting filter 11 and the near infrared cut filter 23 may be formed on the support 1.

<Optical Sensor>

Next, an optical sensor according to the embodiment of the present invention will be described. The optical sensor according to the embodiment of the present invention includes the structure according to the embodiment of the present invention. More specifically, the optical sensor according to the embodiment of the present invention includes the first near infrared transmitting filter and the second near infrared transmitting filter that are provided at different positions on a light receiving section of the optical sensor.

It is preferable that the optical sensor according to the embodiment of the present invention includes a light source that emits two or more light components having different wavelengths By using the light source, information can be acquired from a plurality of near infrared light components, and noise can be further reduced by signal subtraction processing. Further, a plurality of near infrared light components can be simultaneously detected such that multiple sensing can be performed. In addition, the two or more light components having different wavelengths may be emitted from the same light source, or the light components having different wavelengths may be emitted from the respective light sources. That is, only one light source may be used, or two or more light sources may be used. In particular, from the viewpoint of reducing noise, it is preferable that two or more light sources are used and the light components having different wavelengths are emitted from the respective light sources.

In addition, it is preferable that the light components having different wavelengths emitted from the light source include at least: light having a wavelength at which transmittances of the first near infrared transmitting filter and the second near infrared transmitting filter are 50% or higher (more preferably 60% or higher, and still more preferably 70% or higher); and light having a wavelength at which a transmittance of the first near infrared transmitting filter is 50% or higher (more preferably 60% or higher and still more preferably 70% or higher) and a transmittance of the second near infrared transmitting filter is 20% or lower (more preferably 15% or lower and still more preferably 10% or lower). In addition, it is preferable that the light components having different wavelengths emitted from the light source include at least light having the wavelength $\lambda_A$ and light having the wavelength $\lambda_B$. According to this aspect, information regarding near infrared light with further reduced noise can be obtained. The light having the wavelength $\lambda_A$ is light in a wavelength range of the wavelength $\lambda_1$ to the wavelength $\lambda_2$, and the light having the wavelength $\lambda_B$ is light having the wavelength $\lambda_2$ or longer.

Examples of a combination of the light components having different wavelengths emitted from the light source include: a combination of light having a wavelength selected in a range of 650 to 700 nm and light having a wavelength selected in a range of 800 to 850 nm; a combination of light having a wavelength selected in a range of 650 to 700 nm and light having a wavelength selected in a range of 900 to 950 nm; a combination of light having a wavelength selected in a range of 800 to 850 nm and light having a wavelength selected in a range of 900 to 950 nm; and a combination of light having a wavelength selected in a range of 650 to 700 nm, light having a wavelength selected in a range of 800 to 850 nm, and light having a wavelength selected in a range of 900 to 950 nm. The wavelengths of the light components emitted from the light source can be appropriately selected depending on the characteristics of the first near infrared transmitting filter and the second near infrared transmitting filter.

<Kit>

Next, a kit that is used for forming the first near infrared transmitting filter and the second near infrared transmitting filter in the structure according to the embodiment of the present invention will be described.

The kit according to the embodiment of the present invention comprises:

a first near infrared transmitting filter-forming composition that includes a light shielding material and a curable compound; and a second near infrared transmitting filter-forming composition that includes a light shielding material and a curable compound.

Hereinafter, the first near infrared transmitting filter-forming composition and the second near infrared transmitting filter-forming composition will also be collectively referred to as "near infrared transmitting filter-forming composition".

In the near infrared transmitting filter-forming composition, a ratio Amin/Bmax of a minimum value Amin of an absorbance of the composition in a wavelength range of 400 to 640 nm to a maximum value Bmax of an absorbance of the composition in a wavelength range of 1100 to 1300 nm is preferably 5 or higher, more preferably 7.5 or higher, still more preferably 15 or higher, and still more preferably 30 or higher.

An absorbance $A\lambda$ at a wavelength $\lambda$ is defined by the following Expression (1).

$$A\lambda = -\log(T\lambda/100) \qquad (1)$$

$A\lambda$ represents the absorbance at the wavelength $\lambda$, and $T\lambda$ represents a transmittance (%) at the wavelength $\lambda$.

In the present invention, a value of the absorbance may be a value measured in the form of a solution or a value of a film which is formed using the near infrared transmitting filter-forming composition. In a case where the absorbance is measured in the form of the film, it is preferable that the absorbance is measured using a film that is formed by applying the near infrared transmitting filter-forming composition to a glass substrate using a method such as spin coating such that the thickness of the dried film is a predetermined value, and drying the applied near infrared transmitting filter-forming composition using a hot plate at 100° C. for 120 seconds. The thickness of the film can be obtained by measuring the thickness of the substrate including the film using a stylus surface profilometer (DEKTAK 150, manufactured by ULVAC Inc.).

In addition, the absorbance can be measured using a well-known spectrophotometer of the related art. Measurement conditions of the absorbance are not particularly limited. It is preferable that the maximum value B of the absorbance in a wavelength range of 1100 to 1300 nm is measured under conditions which are adjusted such that the minimum value A of the absorbance in a wavelength range of 400 to 640 nm is 0.1 to 3.0. By measuring the absorbance under the above-described conditions, a measurement error can be further reduced. A method of adjusting the minimum value A of the absorbance in a wavelength range of 400 to 640 nm to be 0.1 to 3.0 is not particularly limited. For example, in a case where the absorbance is measured in the form of a solution, for example, a method of adjusting the optical path length of a sample cell can be used. In addition, in a case where the absorbance is measured in the form of the film, for example, a method of adjusting the thickness of the film can be used.

In addition, it is more preferable that the near infrared transmitting filter-forming composition according to the embodiment of the present invention satisfies at least one of the following spectral characteristics (1) to (4).

(1) A ratio Amin1/Bmax1 of a minimum value Amin1 of an absorbance of the near infrared transmitting filter-forming composition in a wavelength range of 400 to 640 nm to a maximum value Bmax1 of an absorbance of the near infrared transmitting filter-forming composition in a wavelength range of 800 to 1300 nm is 5 or higher, preferably 7.5 or higher, more preferably 15 or higher, and still more preferably 30 or higher. According to this aspect, a film that can shield light in a wavelength range of 400 to 640 nm and allows transmission of light having a wavelength of longer than 670 nm can be formed.

(2) A ratio Amin2/Bmax2 of a minimum value Amin2 of an absorbance of the near infrared transmitting filter-forming composition in a wavelength range of 400 to 750 nm to a maximum value Bmax2 of an absorbance of the near infrared transmitting filter-forming composition in a wavelength range of 900 to 1300 nm is 5 or higher, preferably 7.5 or higher, more preferably 15 or higher, and still more preferably 30 or higher. According to this aspect, a film that can shield light in a wavelength range of 400 to 750 nm and allows transmission of light having a wavelength of longer than 800 nm can be formed.

(3) A ratio Amin3/Bmax3 of a minimum value Amin3 of an absorbance of the near infrared transmitting filter-forming composition in a wavelength range of 400 to 830 nm to a maximum value Bmax3 of an absorbance of the near infrared transmitting filter-forming composition in a wavelength range of 1000 to 1300 nm is 5 or higher, preferably 7.5 or higher, more preferably 15 or higher, and still more preferably 30 or higher. According to this aspect, a film that can shield light in a wavelength range of 400 to 830 nm and allows transmission of light having a wavelength of longer than 900 nm can be formed.

(4) A ratio Amin4/Bmax4 of a minimum value Amin4 of an absorbance of the near infrared transmitting filter-forming composition in a wavelength range of 400 to 950 nm to a maximum value Bmax4 of an absorbance of the near infrared transmitting filter-forming composition in a wavelength range of 1100 to 1300 nm is 5 or higher, preferably 7.5 or higher, more preferably 15 or higher, and still more preferably 30 or higher. According to this aspect, a film that can shield light in a wavelength range of 400 to 950 nm and allows transmission of light having a wavelength of longer than 1000 nm can be formed.

Examples of a combination of the first near infrared transmitting filter-forming composition and the second near infrared transmitting filter-forming composition include the following examples. In particular, a combination of (2) and (3) described above is preferable because iris can be clearly recognized by using 810 to 820 nm for iris recognition and noise generated from sunlight is small by using light having a wavelength of about 940 nm for distance recognition such that the accuracy of distance recognition is excellent.

(A): a combination in which the first near infrared transmitting filter-forming composition is a composition having the spectral characteristics (1) and the second near infrared transmitting filter-forming composition is a composition having any one of the spectral characteristics (2) to (4)

(B): a combination in which the first near infrared transmitting filter-forming composition is a composition having the spectral characteristics (2) and the second near infrared transmitting filter-forming composition is a composition having the spectral characteristics (3) or (4)

(C): a combination in which the first near infrared transmitting filter-forming composition is a composition having the spectral characteristics (3) and the second near infrared transmitting filter-forming composition is a composition having the spectral characteristics (4)

In a case where a film having a thickness of 1 µm, 2 µm, 3 µm, 4 µm, or 5 µm after drying is formed using the near infrared transmitting filter-forming composition, it is preferable that spectral characteristics are satisfied in which in which a maximum value of a light transmittance of the film in a thickness direction in a wavelength range of 400 to 640 nm is 20% or lower and a minimum value of a light transmittance of the film in the thickness direction in a wavelength range of 1100 to 1300 nm is 70% or higher. The maximum value in a wavelength range of 400 to 640 nm is more preferably 15% or lower and still more preferably 10% or lower. The minimum value in a wavelength range of 1100 to 1300 nm is more preferably 75% or higher and still more preferably 80% or higher.

In addition, it is more preferable that the near infrared transmitting filter-forming composition according to the embodiment of the present invention satisfies at least one of the following spectral characteristics (11) to (14).

(11) An aspect in which, in a case where a film having a thickness of 1 µm, 2 µm, 3 µm, 4 µm, or 5 µm after drying is formed using the near infrared transmitting filter-forming composition, a maximum value of a light transmittance of the film in a thickness direction in a wavelength range of 400 to 640 nm is 20% or lower (preferably 15% or lower and more preferably 10% or lower), and a minimum value of a light transmittance of the film in the thickness direction in a wavelength range of 800 to 1300 nm is 70% or higher (preferably 75% or higher and more preferably 80% or higher).

(12) An aspect in which, in a case where a film having a thickness of 1 µm, 2 µm, 3 µm, 4 µm, or 5 µm after drying is formed using the near infrared transmitting filter-forming composition, a maximum value, of a light transmittance of the film in a thickness direction in a wavelength range of 400 to 750 nm is 20% or lower (preferably 15% or lower and more preferably 10% or lower), and a minimum value of a light transmittance of the film in the thickness direction in a wavelength range of 900 to 1300 nm is 70% or higher (preferably 75% or higher and more preferably 80% or higher).

(13) An aspect in which, in a case where a film having a thickness of 1 µm, 2 µm, 3 µm, 4 µm, or 5 µm after drying is formed using the near infrared transmitting filter-forming composition, a maximum value of a light transmittance of the film in a thickness direction in a wavelength range of 400 to 830 nm is 20% or lower (preferably 15% or lower and more preferably 10% or lower), and a minimum value of a light transmittance of the film in the thickness direction in a wavelength range of 1000 to 1300 nm is 70% or higher (preferably 75% or higher and more preferably 80% or higher).

(14) An aspect in which, in a case where a film having a thickness of 1 µm, 2 µm, 3 µm, 4 µm, or 5 µm after drying is formed using the near infrared transmitting filter-forming composition, a maximum value of a light transmittance of the film in a thickness direction in a wavelength range of 400 to 950 nm is 20% or lower (preferably 15% or lower and more preferably 10% or lower), and a minimum value of a light transmittance of the film in the thickness direction in a wavelength range of 1100 to 1300 nm is 70% or higher (preferably 75% or higher and more preferably 80% or higher).

Hereinafter, each of components which can form the near infrared transmitting filter-forming composition will be described.

<<Light Shielding Material>>

The near infrared transmitting filter-forming composition includes a light shielding material. In the present invention, it is preferable that the light shielding material is a coloring material that absorbs light in a wavelength range of violet to red. In addition, in the present invention, it is preferable that the light shielding material is a coloring material that shields light in a wavelength range of 400 to 640 nm. In addition, it is preferable that the light shielding material is a coloring material that allows transmission of light in a wavelength range of 1100 to 1300 nm. In the present invention, it is preferable that the light shielding material satisfies at least one of the following requirement (1) or (2).

(1): The light shielding material includes two or more chromatic colorants, and a combination of the two or more chromatic colorants forms black.
(2) The light shielding material includes an organic black colorant. In the aspect (2), it is preferable that the light shielding material further includes achromatic colorant.

In the present invention, the chromatic colorant denotes a colorant other than a white colorant and a black colorant. In addition, in the present invention, the organic black colorant used as the light shielding material denotes a material that absorbs visible light and allows transmission of at least a part of near infrared light. Accordingly, in the present invention, the organic black colorant used as the light shielding material does not denote a black colorant that absorbs both visible light and near infrared light, for example, carbon black or titanium black. It is preferable that the organic black colorant is a colorant having a maximum absorption wavelength in a wavelength range of 400 nm to 700 nm.

In the present invention, It is preferable that the light shielding material is a material in which the ratio A/B of the minimum value A of the absorbance in a wavelength range of 400 to 640 nm to the minimum value B of the absorbance in a wavelength range of 1100 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants. In addition, in the aspect (2), the spectral characteristics may be satisfied using an organic black colorant. In addition, the spectral characteristics may be satisfied using a combination of an organic black colorant and a chromatic colorant.

(Chroinatic Colorant)

In the present invention, the chromatic colorant is selected from the group consisting of a red colorant, a green colorant, a blue colorant, a yellow colorant, a violet colorant, and an orange colorant. In the present invention, the chromatic colorant may be a pigment or a dye. It is preferable that the chromatic colorant is a pigment. It is preferable that an average particle size (r) of the pigment satisfies preferably 20 mm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment. In addition, regarding a particle size distribution of the secondary particles of the pigment (hereinafter, simply referred to as "particle size distribution") which can be used, secondary particles having a particle size of (average particle size±100) nm account for preferably 70 mass % or higher and more preferably 80 mass % or higher in the pigment. The particle size distribution of the secondary particles can be measured using a scattering intensity distribution.

It is preferable that the pigment is an organic pigment. Preferable examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments):

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

It is preferable that the light shielding material includes two or more selected from a red colorant, a blue colorant, a yellow colorant, a violet colorant, and a green colorant. That is, it is preferable that the light shielding material forms black using a combination of two or more colorants selected from a red colorant, a blue colorant, a yellow colorant, a violet colorant, and a green colorant. Examples of a preferable combination are as follows.

(1) An aspect in which the light shielding material includes a red colorant and a blue colorant
(2) An aspect in which the light shielding material includes a red colorant, a blue colorant, and a yellow colorant
(3) An aspect in which the light shielding material includes a red colorant, a blue colorant, a yellow colorant, and a violet colorant
(4) An aspect in which the light shielding material includes a red colorant, a blue colorant, a yellow colorant, a violet colorant, and a green colorant
(5) An aspect in which the light shielding material includes a red colorant, a blue colorant, a yellow colorant, and a green colorant
(6) An aspect in which the light shielding material includes a red colorant, a blue colorant, and a green colorant
(7) An aspect in which the light shielding material includes a yellow colorant and a violet colorant In the aspect (1), a mass ratio red colorant:blue colorant between the red colorant and the blue colorant is preferably 20 to 80:20 to 80, more preferably 20 to 60:40 to 80, and more preferably 20 to 50:50 to 80.

In the aspect (2), a mass ratio red colorant:blue colorant: yellow colorant between the red colorant, the blue colorant, and the yellow colorant is preferably 10 to 80:20 to 80:10 to 40, more preferably 10 to 60:30 to 80:10 to 30, and still more preferably 10 to 40:40 to 80:10 to 20.

In the aspect (3), a mass ratio red colorant:blue colorant: yellow colorant:violet colorant between the red colorant, the blue colorant, the yellow colorant, and the violet colorant is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect (4), a mass ratio red colorant:blue colorant: yellow colorant:violet colorant:green colorant between the red colorant, the blue colorant, the yellow colorant, the violet colorant, and the green colorant is preferably 10 to 80:20 to 80:5 to 40:5 to 40:5 to 40, more preferably 10 to 60:30 to 80:5 to 30:5 to 30:5 to 30, and still more preferably 10 to 40:40 to 80:5 to 20:5 to 20:5 to 20.

In the aspect (5), a mass ratio red colorant:blue colorant: yellow colorant:green colorant between the red colorant, the blue colorant, the yellow colorant, and the green colorant is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect (6), a mass ratio red colorant:blue colorant: green colorant between the red colorant, the blue colorant, and the green colorant is preferably 10 to 80:20 to 80:10 to 40, more preferably 10 to 60:30 to 80:10 to 30, and still more preferably 10 to 40:40 to 80:10 to 20.

In the aspect (7), a mass ratio yellow colorant:violet colorant between the yellow colorant and the violet colorant is preferably 10 to 50:40 to 80, more preferably 20 to 40:50 to 70, and still more preferably 30 to 40:60 to 70.

As the yellow colorant, C.I. Pigment Yellow 139, 150, or 185 is preferable, C.I. Pigment Yellow 139 or 150 is more preferable, and C.I. Pigment Yellow 139 is still more preferable. As the blue colorant, C.I. Pigment Blue 15:6 is preferable. As the violet colorant, for example, C.I. Pigment Violet 23 is preferable. As the red colorant, C.I. Pigment Red 122, 177, 224, or 254 is preferable, C.I. Pigment Red 122, 177, or 254 is more preferable, and C.I. Pigment Red 254 is still more preferable. As the green colorant, C.I. Pigment Green 7, 36, 58, or 59 is preferable.

(Organic Black Colorant)

In the present invention, examples of the organic black colorant include a bisbenzofuranone compound, an azomethine compound, a perylene compound, and an azo compound. Among these, a bisbeirzofuranone compound or a perylene compound is preferable. Examples of the bisbenzofuranone compound include a compound described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available.

In the present invention, it is preferable that the bisbenzofuranone compound is one of the following compounds represented by the following formulae or a mixture thereof.

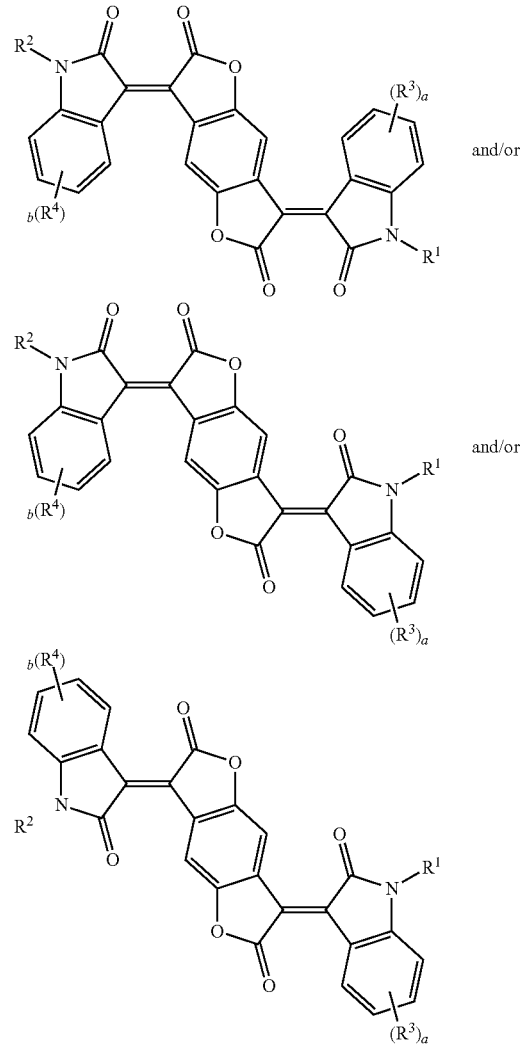

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring.

The substituent represented by $R^1$ to $R^4$ is a halogen atom, a cyano group, a nitro group, an alkyl group, an alkenyl group, an alkynyl group, an aralkyl group, an aryl group, a heteroaryl group, —$OR^{301}$, —$COR^{302}$, —$COOR^{303}$, —$OCOR^{304}$, —$NR^{305}R^{306}$, —$NHCOR^{307}$, —$CONR^{308}R^{309}$, —$NHCONR^{310}R^{311}$, —$NHCOOR^{312}$, —$SR^{313}$, —$SO_2R^{314}$, —$SO_2OR^{315}$, —$NHSO_2R^{316}$, or —$SO_2NR^{317}R^{318}$. $R^{301}$ to $R^{318}$ each independently represent a hydrogen atom, an alkyl group, an alkenyl group, an alkynyl group, an aryl group, or a heteroaryl group.

The details of the bisbenzofuranone compound can be found in paragraphs "0014" to "0037" of JP2010-534726A, the content of which is incorporated herein by reference.

In the present invention, in a case where an organic black colorant is used as the light shielding material, it is preferable that the organic black colorant is used in combination with a chromatic colorant. By using the organic black colorant in combination with a chromatic colorant, excellent spectral characteristics are likely to be obtained. Examples of the chromatic colorant which can be used in combination with the organic black colorant include a red colorant, a blue colorant, and a violet colorant. Among these, a red colorant or a blue colorant is preferable. Among these colorants, one kind may be used alone, or two or more kinds may be used in combination.

In addition, regarding a mixing ratio between the chromatic colorant and the organic black colorant, the amount of the chromatic colorant is preferably 10 to 200 parts by mass and more preferably 15 to 150 parts by mass with respect to 100 parts by mass of the organic black colorant.

In the present invention, the content of the pigment in the light shielding material is preferably 95 mass % or higher, more preferably 97 mass % or higher, and still more preferably 99 mass % or higher with respect to the total mass of the light shielding material.

In the near infrared transmitting filter-forming composition, the content of the light shielding material is preferably 10 to 70 mass % with respect to the total solid content of the near infrared transmitting filter-forming composition. The lower limit is preferably 30 mass % or higher and more preferably 40 mass % or higher.

<<Near Infrared Absorber>>

The near infrared transmitting filter-forming composition may further include a near infrared absorber. In the near infrared transmitting filter, the near infrared absorber has a function of limiting light to be transmitted (near infrared light) to a longer wavelength side.

In the present invention, as the near infrared absorber, a compound having a maximum absorption wavelength in an infrared range (preferably a wavelength range of longer than 700 nm and 1300 nm or shorter) can be preferably used. As the near infrared absorber, a pigment or a dye may be used.

In the present invention, as the near infrared absorber, a near infrared absorbing compound that includes a π-conjugated plane having a monocyclic or fused aromatic ring can be preferably used. The number of atoms constituting the π-conjugated plane included in the near infrared absorbing compound other than hydrogen is preferably 14 or more; more preferably 20 or more, still more preferably 25 or more, and still more preferably 30 or more. For example, the upper limit is preferably 80 or less and more preferably 50 or less.

The number of monocyclic or fused aromatic rings in the π-conjugated plane included in the near infrared absorbing compound is preferably 2 or more, more preferably 3 or more, still more preferably 4 or more, and still more preferably 5 or more. The upper limit is preferably 100 or less, more preferably 50 or less, and still more preferably 30 or less. Examples of the aromatic ring include a benzene ring, a naphthalene ring, a pentalene ring, an indene ring, an azulene ring, a heptalene ring, an indacene ring, a perylene ring, a pentacene ring, a quaterrylene ring, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, and a fused ring including the above-described ring.

It is preferable that the near infrared absorbing compound is a compound having a maximum absorption wavelength in a wavelength range of 700 to 1000 nm. In this specification, "having a maximum absorption wavelength in a wavelength range of 700 to 1000 nm" denotes having a maximum absorbance in a wavelength range of 700 to 1000 nm in an absorption spectrum of the near infrared absorbing compound in a solution. Examples of a measurement solvent used for the measurement of the absorption spectra of the near infrared absorbing compound in the solution include chloroform, methanol, dimethyl sulfoxide, ethyl acetate, and tetrahydrofuran. In the case of a compound which is soluble in chloroform, chloroform is used as the measurement solvent. In the case of a compound which is not soluble in chloroform, methanol is used. In addition, in a case where the near infrared absorbing colorant is a compound which is not soluble in chloroform and methanol, dimethyl sulfoxide is used.

In the present invention, as the near infrared absorbing compound, at least one selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable, at least one selected from a pyrrolopyrrole compound, a cyanine compound, a squarylium compound, a phthalocyanine compound, a naphthalocyanine compound, or a diimmonium compound is more preferable, at least one selected from a pyrrolopyrrole compound, a cyanine compound, and a squarylium compound is still more preferable, or a pyrrolopyrrole compound is still more preferable. Examples of the diimmonium compound include a compound described in JP2008-528706A, the content of which is incorporated herein by reference. Examples of the phthalocyanine compound include a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Examples of the naphthalocyanine compound include a compound described in paragraph "0093" of JP2012-077153A, the content of which is incorporated herein by reference. In addition, as the cyanine compound, the phthalocyanine compound, the naphthalocyanine compound, the diimmonium compound, or the squarylium compound, for example, a compound described in paragraphs "0010" to "0081" of JP2010-111750A may be used, the content of which is incorporated herein by reference. In addition, the details of the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference. In addition, a compound described in paragraphs JP2016-146619A can also be used as the near infrared absorbing compound, the content of which is incorporated herein by reference.

As the pyrrolopyrrole compound, a compound represented by Formula (PP) is preferable.

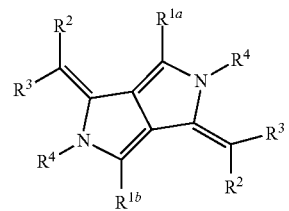

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordination bond with at least one selected from the group consisting of $R^{1a}$, $R^{1b}$, and $R^3$, and $R^{4A}$ and $R^{4B}$ each independently represent a substituent. The details of Formula (PP) can be found in paragraphs "0017" to "0047" of JP2009-263614A, paragraphs "0011" to "0036" of JP2011-068731A, and paragraphs "0010" to "0024" of WO2015/166873A, the contents of which are incorporated herein by reference.

$R^{1a}$ and $R^{1b}$ each independently represent preferably an aryl group or a heteroaryl group, and more preferably an aryl group. In addition, the alkyl group, the aryl group, and the heteroaryl group represented by $R^{1a}$ to $R^{1b}$ may have a substituent or may be unsubstituted. Examples of the substituent include an alkoxy group, a hydroxy group, a halogen atom, a cyano group, a nitro group, —$OCOR^{11}$, —$SOR^{12}$, and —$SO_2R^{13}$. $R^{11}$ to $R^{13}$ each independently represent a hydrocarbon group or a heteroaryl group. In addition, examples of the substituent include substituents described in paragraphs "0920" to "0022" of 2009-263614A. Among these, as the substituent, an alkoxy group, a hydroxy group, a cyano group, a nitro group, —$OCOR^{11}$, —$SOR^{12}$, or —$SO_2R^{13}$ is preferable. As the group represented by $R^{1a}$ and $R^{1b}$, an aryl group which has an alkoxy group having a branched alkyl group as a substituent, an aryl group which has a hydroxy group as a substituent, or an aryl group which has a group represented by —$OCOR^{11}$ as a substituent is preferable. The number of carbon atoms in the branched alkyl group is preferably 3 to 30 and more preferably 3 to 20.

It is preferable that at least one of $R^2$ or $R^3$ represents an electron-withdrawing group, and it is more preferable that $R^2$ represents an electron-withdrawing group (preferably a cyano group) and $R^3$ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms. Two $R^2$'s in Formula (PP) may be the same as or different from each other. In addition, two $R^3$'s in Formula (PP) may be the same as or different from each other.

$R^4$ represents preferably a hydrogen atom, an alkyl group, an aryl group, a heteroaryl group, or a group represented by —$BR^{4A}R^{4B}$, more preferably a hydrogen atom, an alkyl group, an aryl group, or a group represented by —$BR^{4A}R^{4B}$, and still more, preferably a group represented by —$BR^{4A}R^{4B}$. As the substituent represented by $R^{4A}$ and $R^{4B}$, a halogen atom, an alkyl group, an alkoxy group, an aryl group, or a heteroaryl group is preferable, an alkyl group, an aryl group, or a heteroaryl group is more preferable, and an aryl group is still more preferable. Each of the groups may further have a substituent. Two $R^4$'s in Formula (PP) may be the same as or different from each other.

Specific examples of the compound represented by Formula (PP) include the following compounds. In the following structural formulae, Me represents a methyl group, and Ph represents a phenyl group. In addition, Examples of the pyrrolopyrrole compound include compounds described in paragraphs "0016" to "0058" of JP2009-263614A, compounds described in paragraphs "0037" to "0052" of JP2011-068731A, compounds described in paragraphs "0010" to "0033" of WO2015/166873A, the contents of which are incorporated herein by reference:

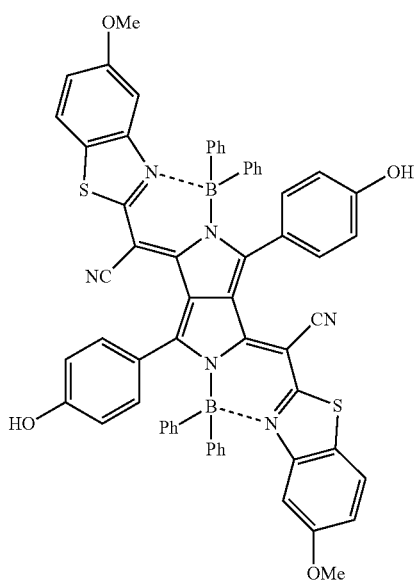

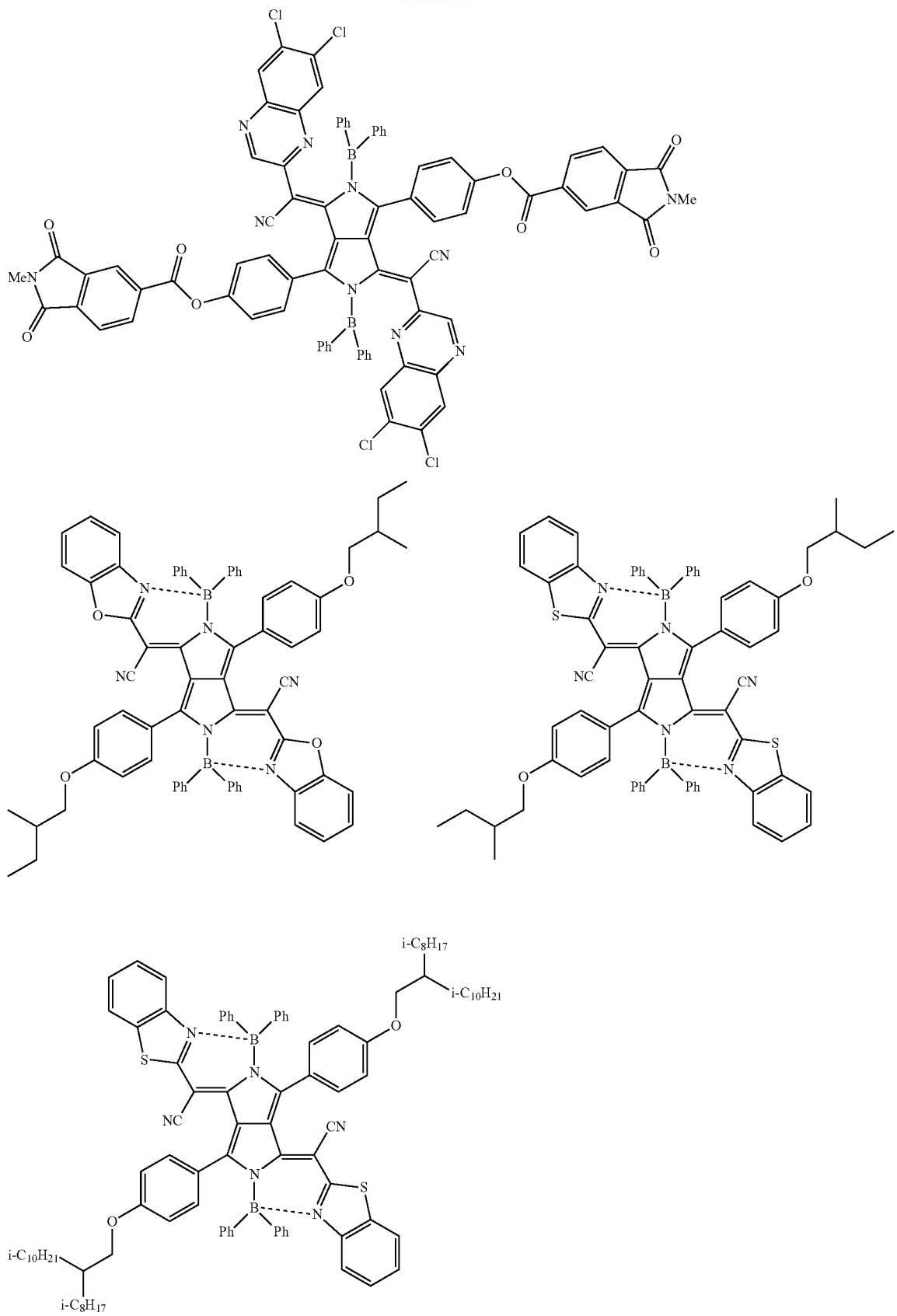

As the squarylium compound, a compound represented by the following Formula (SQ) is preferable.

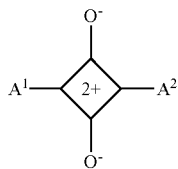

(SQ)

In Formula (SQ), $A^1$ and $A^2$ each independently represent an aryl group, a heteroaryl group, or a group represented by the following Formula (A-1).

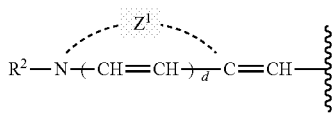

(A-1)

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond.

The number of carbon atoms in the aryl group represented by $A^1$ and $A^2$ is preferably 6 to 48, more preferably 6 to 24, and still more preferably 6 to 12.

It is preferable that the heteroaryl group represented by $A^1$ and $A^2$ is a 5- or 6-membered ring. In addition, the heteroaryl group is preferably a monocycle or a fused ring composed of 2 to 8 rings, more preferably a monocycle or a fused ring composed of 2 to 4 rings, and still more preferably a monocycle or a fused ring composed of 2 or 3 rings. Examples of a heteroatom constituting the ring of the heteroaryl group include a nitrogen atom, an oxygen atom, and a sulfur atom. Among these, a nitrogen atom or a sulfur atom is preferable. The number of heteroatoms constituting the ring of the heteroaryl group is preferably 1 to 3 and more preferably 1 or 2.

The aryl group and the heteroaryl group may have a substituent. In a case where the aryl group and the heteroaryl group have two or more substituents, the substituents may be the same as or different from each other.

Examples of the substituent include a halogen atom, a cyano group, a nitro group, an alkyl group, an alkenyl group, an alkynyl group, an aryl group, a heteroaryl group, an aralkyl group, $-OR^{10}$, $-COR^{11}$, $-COOR^{12}$, $-OCOR^{13}$, $-NR^{14}R^{15}$, $-NHCOR^{16}$, $-CONR^{17}R^{18}$, $-NHCONR^{19}R^{20}$, $-NHCOOR^{21}$, $-SR^{22}$, $-SO_2R^{23}$, $-SO_2OR^{24}$, $-NHSO_2R^{25}$, and $-SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in $-COOR^{12}$ represents a hydrogen atom, the hydrogen atom may be dissociable or may be in the form of a salt. In a case where $R^{24}$ in $-SO_2OR^{24}$ represents a hydrogen atom, the hydrogen atom may be dissociable or may be in the form of a salt.

Next, the group represented by Formula (A-1) which is represented by $A^1$ and $A^2$ will be described.

In Formula (A-1), $R^2$ represents an alkyl group, an alkenyl group, or an aralkyl group and preferably an alkyl group. In Formula (A-1), the nitrogen-containing heterocycle formed by $Z^1$ is preferably a 5- or 6-membered ring. In addition, the nitrogen-containing heterocycle is preferably a monocycle or a fused ring composed of 2 to 8 rings, more preferably a monocycle or a fused ring composed of 2 to 4 rings, and still more preferably a fused ring composed of 2 or 3 rings. In addition to a nitrogen atom, the nitrogen-containing heterocycle may include a sulfur atom. In addition, the nitrogen-containing, heterocycle may have a substituent. Examples of the substituent include the above-described substituents.

The details of Formula (SQ) can be found in paragraphs "0020" to "0049" of JP2011-208101A, the content of which is incorporated herein by reference.

As shown below, cations in Formula (SQ) are present without being localized.

It is preferable that the squarylium compound is a compound represented by the following Formula (SQ-1).

(SQ-1)

A ring A and a ring B each independently represent an aromatic ring.

$X^A$ and $X^B$ each independently represent a substituent.

$G^A$ and $G^B$ each independently represent a substituent.

kA represents an integer of 0 to $n_A$, and kB represents an integer of 0 to $n_B$.

$n_A$ and $n_B$ represents integers representing the maximum numbers of $G^A$'s and GB's which may be substituted in the ring A and the ring B, respectively.

$X^A$ and $G^A$, or $X^B$ and $G^B$ may be bonded to each other, and in a case where a plurality of $G^A$'s and a plurality of $G^B$'s are present, $G^A$'s and $G^B$'s may be bonded to each other to form ring structures, respectively.

Examples of the substituent represented by $G^A$ and $G^B$ include the substituents described above regarding the Formula (SQ).

Examples of the substituent represented by $X^A$ and $X^B$ include the substituents described above regarding Formula (SQ). Among these, a group having active hydrogen is preferable, $-OH$, $-SH$, $-COOH$, $-SO_3H$, $-NR^{X1}R^{X2}$, $-NHCOR^{X1}$, $-CONR^{X1}R^{X2}$, $-NHCONR^{X1}R^{X2}$, $-NHCOOR^{X1}$, $-NHSO_2R^{X1}$, $-B(OH)_2$, or $-PO(OH)_2$ is more preferable; and $-OH$, $-SH$, or $-NR^{X1}R^{X2}$ is still more preferable.

$R^{X1}$ and $R^{X2}$ each independently represent a hydrogen atom or a substituent. Examples of the substituent include an alkyl group, an alkenyl group, an alkynyl group, an aryl group, and a heteroaryl group. Among these, an alkyl group is preferable.

The ring A and the ring B each independently represent an aromatic ring. The aromatic ring may be a monocycle or a fused ring. Specific examples of the aromatic ring include a benzene ring, a naphthalene ring, a pentalene ring, an indene ring, an azulene ring, a heptalene ring, an indacene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring or a naphthalene ring is preferable. The aromatic ring may be unsubstituted or may have a substituent. Examples of the substituent include the substituents described above regarding the Formula (SQ).

$X^A$ and $G^A$, or $X^B$ and $G^B$ may be bonded to each other to form a ring, and in a case where a plurality of $G^A$'s and a plurality of $G^B$'s are present, $G^A$'s or $G^B$'s may be bonded to each other to form a ring. It is preferable that the ring is a 5- or 6-membered ring. The ring may be a monocycle or a fused ring. In a case where $X^A$ and $G^A$, $X^B$ and $G^B$, $G^A$'s, or $G^B$'s are bonded to each other to form a ring, the groups may be directly bonded to each other to form a ring, or may be bonded to each other to form a ring through a divalent linking group selected from the group consisting of an alkylene group, —CO—, —O—, —NH—, —BR—, and a combination thereof to form a ring. It is preferable that $X^A$ and $G^A$, $X^B$ and $G^B$, $G^A$'s, or $G^B$'s are bonded to each other through —BR— to form a ring. R represents a hydrogen atom or a substituent. Examples of the substituent include the substituents described above regarding Formula (SQ). Among these, an alkyl group or an aryl group is preferable.

kA represents an integer of 0 to $n_A$, kB represents an integer of 0 to $n_B$, $n_A$ represents an integer representing the maximum number of $G^A$'s which may be substituted in the ring A, and $n_B$ represents an integer representing the maximum number of $G^B$'s which may be substituted in the ring B. kA and kB each independently represent preferably an integer of 0 to 4, more preferably 0 to 2, and still more preferably 0 or 1.

Specific examples of the squarylium compound include the following compounds. In the following structural formula, EH represents an ethylhexyl group. Examples of the squarylium compound include a compound described in paragraphs "0044" to "0049" of JP2011-208101A, the content of which is incorporated herein by reference.

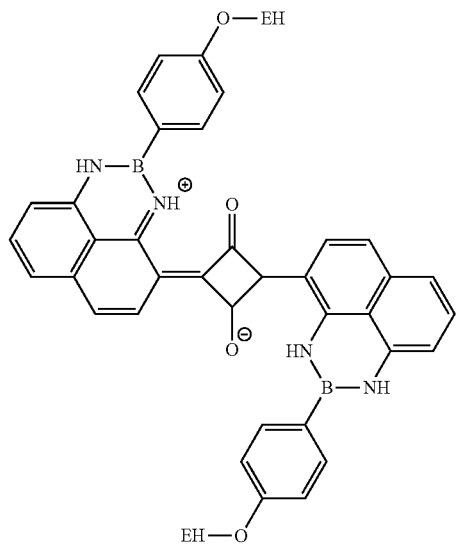

As the cyanine compound, a compound represented by Formula (C) is preferable. Formula (C)

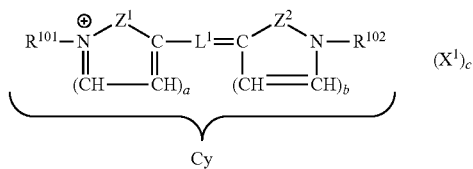

In the formula, $Z^1$ and $Z^2$ each independently represent a non-metal atomic group for forming a 5- or 6-membered nitrogen-containing heterocycle which may be fused, $R^{101}$ and $R^{102}$ each independently represent an alkyl group, an alkenyl group, an alkynyl group, an aralkyl group, or an aryl group, $L^1$ represents a methine chain including an odd number of methine groups, a and b each independently represent 0 or 1, in a case where a represents 0, a carbon atom and a nitrogen atom are bonded through a double bond. In a case where b represents 0, a carbon atom and a nitrogen atom are bonded through a single bond, and in a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

In Formula (C), $Z^1$ and $Z^2$ each independently represent a non-metal atomic group for forming a 5- or 6-membered nitrogen-containing heterocycle which may be fused. Another heterocycle, an aromatic ring, or an aliphatic ring may be fused to the nitrogen-containing heterocycle. It is preferable that the nitrogen-containing heterocycle is a 5-membered ring. A structure in which a benzene ring or a naphthalene ring is fused to the 5-membered nitrogen-containing heterocycle is more preferable. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazole ring, an indolenine ring, a benzoindolenine ring, an imidazole ring, a benzimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, a benzothiazole ring, or a benzimidazole ring is preferable, and an indolenine ring, a benzothiazole ring, or a benzimidazole ring is more preferable. The nitrogen-containing heterocycle and a ring fused thereto may have a substituent. Examples of the substituent include the substituents described above regarding Formula (SQ).

In Formula (C), $R^{101}$ and $R^{102}$ each independently represent an alkyl group, an alkenyl group, an alkynyl group, an aralkyl group, or an aryl group. These groups may have a substituent or may be unsubstituted. Examples of the substituent include the substituents described above regarding Formula (SQ).

In Formula (C), $L^1$ represents a methine chain including an odd number of methine groups. It is preferable that $L^1$ represents a methine chain including 3, 5, or 7 methine groups.

The methine group may have a substituent. It is preferable that the methine group having a substituent is a methine group positioned at the center (meso position). Specific examples of the substituent include the substituent described regarding the Formula (SQ) and a group represented by Formula (a). In addition, two substituents in the methine chain may be bonded to each other to form a 5- or 6-membered ring.

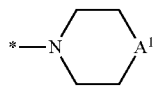

(a)

In Formula (a), * represents a linking portion to the methine chain, and $A^1$ represents —O—.

In Formula (C), a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (C) will be shown below.

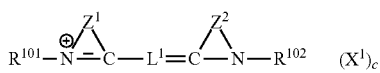

In a case where a site represented by Cy in Formula (C) is a cation site, $X^1$ represents an anion, and c represents the number of $X^1$'s for balancing charge. Examples of the anion include an halide ion (Cl⁻, Br⁻, or I⁻), a p-toluenesulfonate ion, an ethyl sulfate ion, $PF_6^-$, $BF_4^-$ $ClO_4^-$, a tris(halogenoalkylsufonyl)methide anion (for example, $(CF_3SO_2)_3C^-$), a di(halogenoalkylsulfonyl)imide anion (for example, $(CF_3SO_2)_2N^-$), and a tetracyanoborate anion.

In a case where a site represented by Cy in Formula (C) is an anion site, $X^1$ represents a cation, and c represents the number of $X^1$'s for balancing charge. Examples of the cation include an alkali metal ion (for example, Li⁺, Na⁺, or K⁺), an alkali earth metal ion ($Mg^{2+}$, $Ca^{2+}$, $Ba^{2+}$, or $Sr^{2+}$), a transition metal ion (for example, Ag⁺, $Fe^{2+}$, $Co^{2+}$, $Ni^{2+}$, $Cu^{2+}$, or $Zn^{2+}$), other metal ions (for example, $Al^{3+}$), an ammonium ion, a triethylammonium ion, a tributylammonium ion, a pyridinium ion, a tetrabutylammonium ion, a guanidinium ion, a tetramethylguanidinium ion, and a diazabicycloundecenium ion. As the cation, Na⁺, K⁺, $Mg^{2+}$, $Ca^{2+}$, $Zn^{2+}$, or a diazabicycloundecenium ion is preferable.

In a case where charge of a site represented by Cy in Formula (C) is neutralized in a molecule, $X^1$ is not present. That is, c represents 0.

It is preferable that the cyanine compound is a compound represented by any one of the following Formulae (C-1) to (C-3).

(C-1)

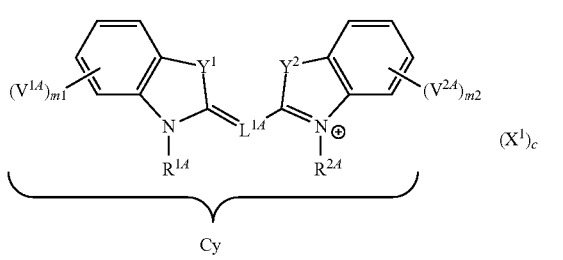

(C-2)

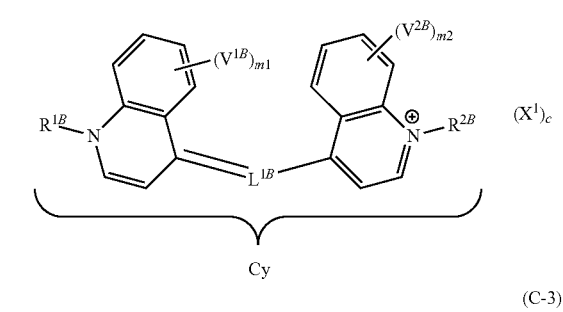

(C-3)

In the formulae, $R^{1A}$, $R^{2A}$, $R^{1B}$, and $R^{2B}$ each independently represent an alkyl group, an alkenyl group, an alkynyl group, an aralkyl group; or an aryl group.

$L^{1A}$ and $L^{1B}$ each independently represent a methine chain including an odd number of methine groups.

$Y^1$ and $Y^2$ each independently represent —S—, —O—, —$NR^{X1}$— or, —$CR^{X2}R^{X3}$—.

$R^{X1}$, $R^{X2}$, and $R^{X3}$ each independently represent a hydrogen atom or an alkyl group.

$V^{1A}$, $V^{2A}$, $V^{1b}$, and $V^{2B}$ each independently represent a substituent.

m1 and m2 each independently represent 0 to 4.

In a case where a site represented by Cy in the formula is a cation site, $X^1$ represents an anion, and c represents the number of $X^1$'s for balancing charge.

In a case where a site represented by Cy in the formula is an anion site, $X^1$ represents a cation, and c represents the number of $X^1$'s for balancing charge.

In a case where charge of a site represented by Cy is neutralized in a molecule, $X^1$ is not present.

The groups represented by $R^{1A}$, $R^{2A}$, $R^{3B}$, and $R^{2B}$ have the same definitions and the same preferable ranges as those of the alkyl group, the alkenyl group, the alkynyl group, the aralkyl group, and the aryl group described regarding $R^{101}$ and $R^{102}$ of Formula (C).

$Y^1$ and $Y^2$ each independently represent —S—, —O—, —NR$^{X1}$— or, —CR$^{X2}$R$^{X3}$— and preferably —NR$^{X1}$—, $R^{X1}$, $R^{X2}$, and $R^{X3}$ each independently represent a hydrogen atom or an alkyl group and preferably an alkyl group. The number of carbon atoms in the alkyl group is preferably 1 to 10, more preferably 1 to 5, and still more preferably 1 to 3. The alkyl group may be linear, branched, or cyclic and is preferably linear or branched and more preferably linear. The alkyl group is still more preferably a methyl group or an ethyl group.

$L^{1A}$ and $L^{1B}$ have the same definitions and the same preferable ranges as those of $L^1$ in Formula (C).

Examples of the substituent represented by $V^{1A}$, $V^{2A}$, $V^{1B}$, and $V^{2B}$ include the substituents described regarding Formula (SQ).

m1 and m2 each independently represent 0 to 4 and preferably 0 to 2.

The anion and the cation represented by $X^1$ have the same range and definitions and the same preferable ranges as those described regarding $X^1$ in Formula (C).

Specific examples of the cyanine compound include the following compounds. In the following structural formulae, Me represents a methyl group. Examples of the cyanine compound include a compound described in paragraphs "0044" and "0045" of JP2009-108267A, a compound described in paragraphs "0026" to "0030" of JP2002-194040, a compound described in JP2015-172004A, a compound described in JP2015-172102A, and a compound described in JP2008-088426A, the contents of which are incorporated herein by reference.

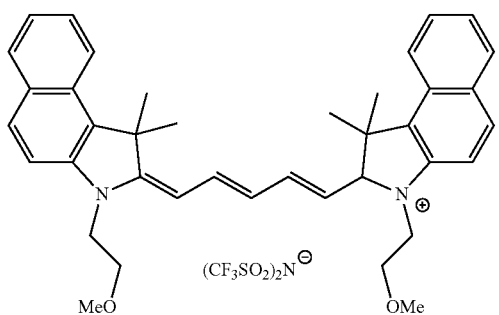

In the present invention, as the near infrared absorbing compound, a commercially available product can also be used. Examples of the commercially available product include SDO-C33 (manufactured by Arimoto Chemical Co., Ltd.); EXCOLOR IR-14, EXCOLOR IR-10A, EXCOLOR TX-EX-801B, and EXCOLOR TX-EX-805K (manufactured by Nippon Shokubai Co., Ltd.); Shigenox NIA-8041, Shigenox NIA-8042, Shigenox NIA-814, Shigenox NIA-820, and Shigenox NIA-839 (manufactured by Hakkol Chemical Co., Ltd.); Epolite V-63, Epolight 3801, and Epolight3036 (manufactured by Epolin Inc.); PRO-JET 825LDI (manufactured by Fujifilm Corporation); NK-3027 and NK-5060 (manufactured by Hayashibara Co., Ltd.); and YKR-3070 (manufactured by Mitsui Chemicals, Inc.).

In the near infrared transmitting filter-forming composition, as the near infrared absorber, inorganic particles can also be used. The shape of the inorganic particles is not particularly limited and may have a sheet shape, a wire shape, or a tube shape irrespective of whether or not the shape is spherical or non-spherical. As the inorganic particles, metal oxide particles or metal particles are preferable. Examples of the metal oxide particles include indium tin oxide (ITO) particles, antimony tin oxide (ATO) particles, zinc oxide (ZnO) particles, Al-doped zinc oxide (Al-doped ZnO) particle's, fluorine-doped tin dioxide (F-doped SnO$_2$) particles, and niobium-doped titanium dioxide (Nb-doped TiO$_2$) particles. Examples of the metal particles include silver (Ag) particles, gold (Au) particles, copper (Cu) particles, and nickel (Ni) particles. In addition, as the inorganic particles, a tungsten oxide compound can also be used. As the tungsten oxide compound, cesium tungsten oxide is preferable. The details of the tungsten oxide compound can be found in paragraph "0080" of JP2016-006476A, the content of which is incorporated herein by reference.

In a case where the near infrared transmitting filter-forming composition includes a near infrared absorber, the content of the near infrared absorber is preferably 1 to 30 mass % with respect to the total solid content of the near infrared transmitting filter-forming composition. The upper limit is preferably 20 mass % or lower, and more preferably 10 mass % or lower. The lower limit is preferably 3 mass % or higher and more preferably 5 mass % or higher. In addition, the total content of the near infrared absorber and the light shielding material is preferably 10 to 70 mass % with respect to the total solid content of the near infrared transmitting filter-forming composition. The lower limit is preferably 20 mass % or higher and more preferably 25 mass % or higher. In addition, the content of the near infrared absorber is preferably 5 to 40 mass % with respect to the total content of the near infrared absorber and the light shielding material. The upper limit is preferably 30 mass % or lower and more preferably 25 mass % or lower. The lower limit is preferably 10 mass % or higher and more preferably 15 mass % or higher.

In the near infrared transmitting filter-forming composition, as the near infrared absorber, one infrared absorber may be used alone, or two or more infrared absorbers may be used in combination. In a case where two or more near infrared absorbers are used in combination, it is preferable that the total content of the near infrared absorbers is in the above-described range.

<<Curable Compound>>

It is preferable that the near infrared transmitting filter-forming composition includes a curable compound. As the curable compound, a well-known compound which is cross-linkable by a radical, an acid, or heat can be used. Examples of the crosslinking compound include a compound which has a group having an ethylenically unsaturated bond and a compound having a cyclic ether group. Examples of the group having an ethylenically unsaturated bond include a vinyl group, a (meth)allyl group, and a (meth)acryloyl group. Examples of the cyclic ether group include an epoxy group and an oxetanyl group. In the present invention, as the curable compound, a radically polymerizable compound or a cationically polymerizable compound is preferable, and a radically polymerizable compound is more preferable.

The content of the curable compound is preferably 0.1 to 40 mass % with respect to the total solid content of the composition. For example, the lower limit is preferably 0.5 mass % or higher and more preferably 1 mass % or higher. For example, the upper limit is more preferably 30 mass % or lower and still more preferably 20 mass % or lower. As the curable compound, one kind may be used alone, or two or more kinds may be used in combination. In a case where two or more curable compounds are used in combination, it is preferable that the total content of the two or more curable compounds is in the above-described range.

(Radically Polymerizable Compound)

The radically polymerizable compound is not particularly limited as long as it is a compound that is polymerizable by the action of a radical. As the radically polymerizable compound, a compound having one or more groups having an ethylenically unsaturated bond is preferable, a compound having two or more groups having an ethylenically unsaturated bond is more preferable, and a compound having three or more groups having an ethylenically unsaturated bond is still more preferable. The upper limit of the number of the groups having an ethylenically unsaturated bond is, for example, preferably 15 or less and more preferably 6 or less. Examples of the group having an ethylenically unsaturated bond include a vinyl group, a styryl group, a (meth)allyl group, and a (meth)acryloyl group. Among these, a (meth)acryloyl group is preferable. The radically polymerizable compound is preferably a (meth)acrylate compound having 3 to 15 functional groups and more preferably a (meth)acrylate compound having 3 to 6 functional groups.

The radically polymerizable compound may be in the form of a monomer or a polymer and is preferably a monomer. The molecular weight of the monomer type radically polymerizable compound is preferably 200 to 3000. The upper limit of the molecular weight is preferably 2500 or lower and more preferably 2000 or lower. The lower limit of the molecular weight is preferably 250 or higher and more preferably 300 or higher.

Examples of the radically polymerizable compound can be, found in paragraphs "0033" and "0034" of JP2013-253224A, the content of which is incorporated herein by reference. As the polymerizable compound, ethyleneoxy-modified pentaerythritol tetraacrylate (as a commercially available product, NK ESTER ATM-35E manufactured by Shin-Nakamura Chemical. Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol residue and/or a propylene glycol residue is preferable. In addition, oligomers of the above-described examples can be used. For example, the details of the polymerizable compound can be found in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the contents of which are incorporated herein by reference. In addition, diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used. In addition, as the radically polymerizable compound, ARONIX M-350 or TO-2349 (manufactured by Toagosei Co., Ltd.) can also be used.

The radically polymerizable compound may have an acid group such as a carboxyl group, a sulfo group, or a phosphate group. Examples of the radically polymerizable compound having an acid group include an ester of an aliphatic polyhydroxy compound and an unsaturated carboxylic acid. A polymerizable compound having an acid group obtained, by causing a nonaromatic carboxylic anhydride to react with an unreacted hydroxy group of an aliphatic polyhydroxy compound is preferable. In particular, it is more preferable that, in this ester, the aliphatic polyhydroxy compound is pentaerythritol and/or dipentaerythritol. Examples of a commercially available product of the monomer having an acid group include M-305, M-510, and M-520 of ARONIX series as polybasic acid-modified acrylic oligomer (manufactured by Toagosei Co., Ltd.). The acid value of the radically polymerizable compound having an acid group is preferably 0.1 to 40 mgKOH/g. The lower limit is preferably 5 mgKOH/g or higher. The upper limit is preferably 30 mgKOH/g or lower.

In addition, it is also preferable that the radically polymerizable compound is a compound having a caprolactone structure. The radically polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the polymerizable compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARADDPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the radically polymerizable compound, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) can be used. Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600 and AI-600 (manufactured by Kyoeisha Chemical Co., Ltd.).

In a case where the near infrared transmitting filter-forming composition includes the radically polymerizable compound, the content of the radically polymerizable compound is preferably 0.1 to 40 mass % with respect to the total solid content of the near infrared transmitting filter-forming composition. For example, the lower limit is more preferably 0.5 mass % or higher and still more preferably 1 mass % or higher. For example, the upper limit is more preferably 30 mass % or lower and still more preferably 20 mass % or lower. As the radically polymerizable compound, one kind may be used alone, or two or more kinds may be used in combination. In a case where two Or more radically polymerizable compounds are used in combination, it is preferable that the total content of the two or more radically polymerizable compounds is in the above-described range.

(Cationically Polymerizable Compound)

Examples of the cationically polymerizable compound include a compound having a cationically polymerizable group. Examples of the cationically polymerizable group include a cyclic ether group such as an epoxy group or an oxetanyl group and an unsaturated carbon double bond group such as a vinyl ether group or an isobutene group. As the cationically polymerizable compound, a compound having a cyclic ether group is preferable, and a compound having an epoxy group is more preferable.

Examples of the compound having an epoxy group include a compound having one or more epoxy groups in one molecule. In particular, a compound having two or more epoxy groups in One molecule is preferable. The number of epoxy groups in one molecule is preferably 1 to 100. The upper limit of the number of epoxy groups is, for example, 10 or less or 5 or less. The lower limit of the number of epoxy groups is preferably 2 or more.

The compound having an epoxy group may be a low molecular weight compound (for example, molecular weight: lower than 2000 or lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and still more preferably 3000 or lower.

In a case where the compound having an epoxy group is a low molecular weight compound, the compound having an epoxy group is, for example, a compound represented by the following Formula (EP1).

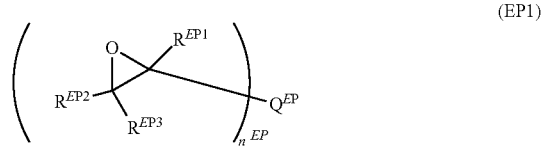

(EP1)

In Formula (EP1), $R^{EP1}$ to $R^{EP3}$ each independently represent a hydrogen atom, a halogen atom, or an alkyl group. The alkyl group may have a cyclic structure or may have a substituent. In addition, $R^{EP1}$ and $R^{EP2}$, or $R^{EP2}$ and $R^{EP3}$ may be bonded to each other to form a ring structure. $Q^{EP}$ represents a single bond or a $n^{EP}$-valent organic group. $R^{EP1}$ to $R^{EP3}$ may be bonded to $Q^{EP}$ to form a ring structure. $n^{EP}$ represents an integer of 2 or more, preferably 2 to 10, and more preferably 2 to 6. In a case where $Q^{EP}$ represents a single bond, $n^{EP}$ represents 2.

The details of $R^{EP1}$ to $R^{EP3}$ and $Q^{EP}$ can be found in paragraphs "0087" and "0088" of JP2014-089408A, the content of which is incorporated herein by reference. Specific examples of the compound represented by Formula (EP1) include a compound described in paragraph "0090" of JP2014-089408A and a compound described in paragraph "0151" of JP2010-054632A, the content of which is incorporated herein by reference.

As the low molecular weight compound, a commercially available product can also be used. Examples of the commercially available product include ADEKA GLYCILOL series manufactured by Adeka Corporation (for example, ADEKA GLYCILOL ED-505) and EPOLEAD series manufactured by Daicel. Corporation (for example, EPOLEAD GT401).

As the compound having an epoxy group, an epoxy resin can be preferably used. Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group, and another silicon compound, and a copolymer of a polymerizable unsaturated compound having an epoxy group and another polymerizable unsaturated compound.

The epoxy equivalent of the epoxy resin is preferably 310 to 3300 g/eq, more preferably 310 to 1700 g/eq, and still more preferably 310 to 1000 g/eq.

As the epoxy resin, a commercially available product can also be used. Examples of the commercially available product include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer).

In the present invention, as the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of this specification are incorporated herein by reference.

In a case where the near infrared transmitting filter-forming composition includes the cationically polymerizable compound, the content of the cationically polymerizable compound is preferably 0.1 to 40 mass % with respect to the total solid content of the near infrared transmitting filter-forming composition. For example, the lower limit is more preferably 0.5 mass % or higher and still more preferably 1 mass % or higher. For example, the upper limit is more preferably 30 mass % or lower and still more preferably 20 mass % or lower. As the cationically polymerizable compound, one kind may be used alone, or two or more kinds may be used in combination. In a case where, two or more cationically polymerizable compounds are used in combination, it is preferable that the total content of the two or more cationically polymerizable compounds is in the above-described range.

In addition, in a case where the near infrared transmitting filter-forming composition includes the radically polymerizable compound and the cationically polymerizable compound, a mass ratio radically polymerizable compound:cationically polymerizable compound is preferably 100:1 to 100:400 and more preferably 100:1 to 100:100.

<<Photoinitiator>>

The near infrared transmitting filter-forming composition may further include a photoinitiator. Examples of the photoinitiator include a photoradical polymerization initiator and a photocationic polymerization initiator. It is preferable that the photoinitiator is selected and used according to the kind of the curable compound. In a case where the radically polymerizable compound is used as the curable compound, it is preferable that the photoradical polymerization initiator is used as the photoinitiator. In a case where the cationically polymerizable compound is used as the curable compound, it is preferable that the photocationic polymerization initiator is used as the photoinitiator. The photoinitiator is not particularly limited and can be appropriately selected from well-known photoinitiators. For example, a compound having photosensitivity to light in a range from an ultraviolet range to a visible range is preferable.

The content of the photoinitiator is preferably 0.1 to 50 mass %, more preferably 0.5 to 30 mass %, and still more preferably 1 to 20 mass % with respect to the total solid content of the near infrared transmitting filter-forming composition. In a case where the content of the photoinitiator is in the above-described range, higher sensitivity and pattern formability can be obtained. The near infrared transmitting filter-forming composition may include one photoinitiator or two or more photoinitiators. In a case where the composition includes two or more photoinitiators, it is preferable that the total content of the photopolymerization initiators is in the above-described range.

(Photoradical Polymerization Initiator)

Examples of the photoradical polymerization initiator include a halogenated hydrocarbon derivative (for example, a compound having a triazine skeleton or a compound having an oxadiazole skeleton), an acylphosphine compound, a hexaaiylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from the group consisting of an oxime compound, an α-hydroxy ketone compound, an α-aminoketone compound, and an acylphosphine compound is more preferable, and an oxime compound is still more preferable. The details of the photoradical polymerization initiator can be found in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

As the oxime compound, a compound described in JP2001-233842A, a compound described in JP2000-080068A, a compound described in JP2006-342166A, or a compound described in JP2016-021012A can be used. Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one. In addition, examples of the oxime compound include a compound described in J. C. S. Perkin II (1979), pp. 1653-1660, J.C.S. Perkin 11 (1979), pp. 156-162 and Journal of Photopolymer Science and Technology (1995), pp. 202-232, JP2000-066385A, JP2000-080068A, JP2004-534797A, or JP2006-342166A. As a commercially available product of the oxime compound, IRGACURE-OXE01, IRGACURE-OXE02, IRGACURE-OXE03, or IRGACURE-OXE04 (all of which are manufactured by BASF SE) can also be preferably used. In addition, TR-PBG-304 (manufactured by Changzhou Tronly New Electronic Materials Co., Ltd.), ADEKA ARKLS NCI-831 (manufactured by Adeka Corporation), ADEKA ARKLS NCI-930 (manufactured by Adeka Corporation), ADEKA OPTOMER. N-1919 (manufactured by Adeka Corporation, a photopolymerization initiator 2 described in JP2012-014052A) can also be used.

In the present invention, an oxime compound having a fluorene ring can also be used as the photoradical polymerization initiator. Specific examples of the oxime compound having a fluorene ring include a compound described in JP2014-137466A. The content of this specification is incorporated herein by reference.

In the present invention, an oxime compound having a fluorine atom can also be used as the photoradical polymerization initiator. Specific examples of the oxime compound having a fluorine atom include a compound described in JP2010-262028A, Compound 24 and 36 to 40 described in JP2014-500852A, and Compound (C-3) described in JP2013-164471A. The content of this specification is incorporated herein by reference.

In the present invention, as the photoradical polymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to 0025" of JP4223071B, and ADEKA ARKLS NCI-831 (manufactured by Adeka Corporation).

Specific examples of the oxime compound which are preferably used in the present invention are shown below, but the present invention is not limited thereto.

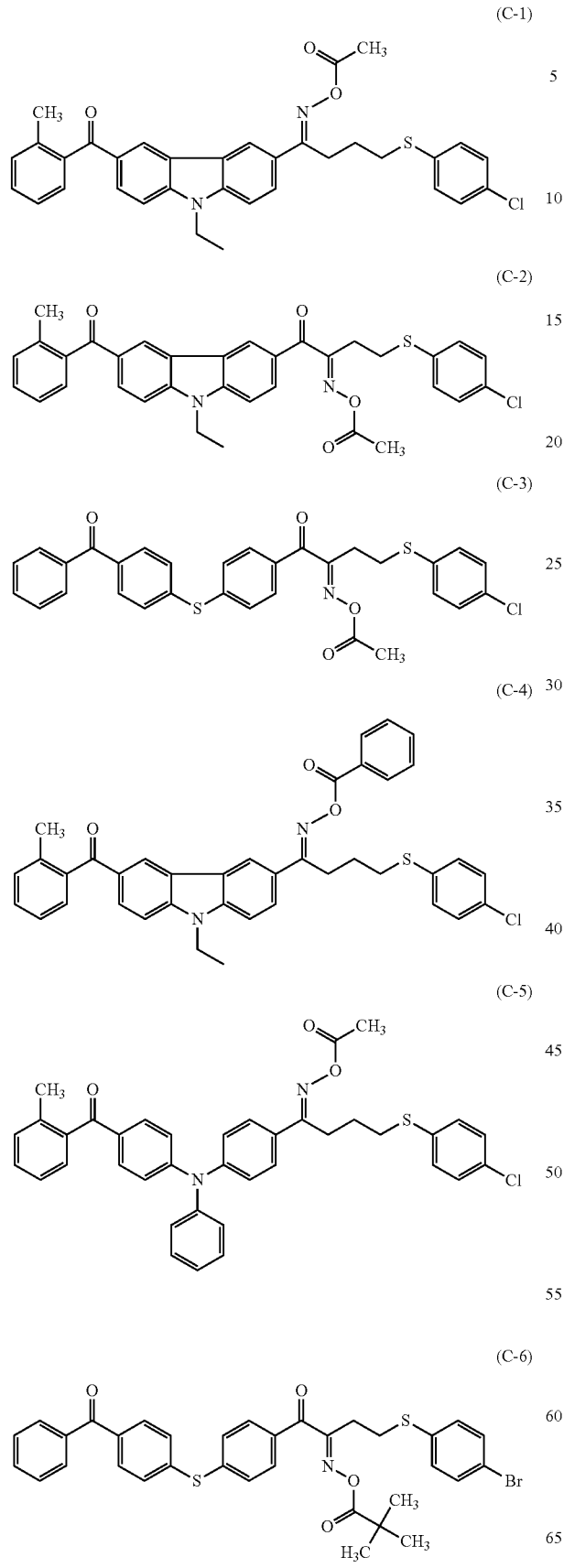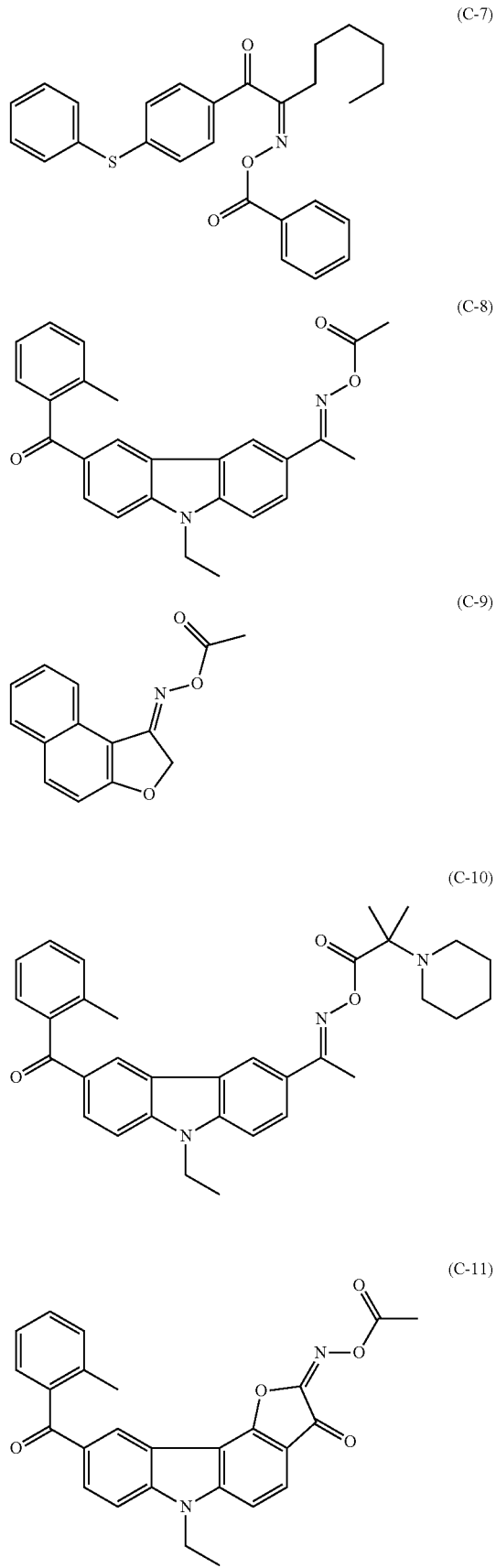

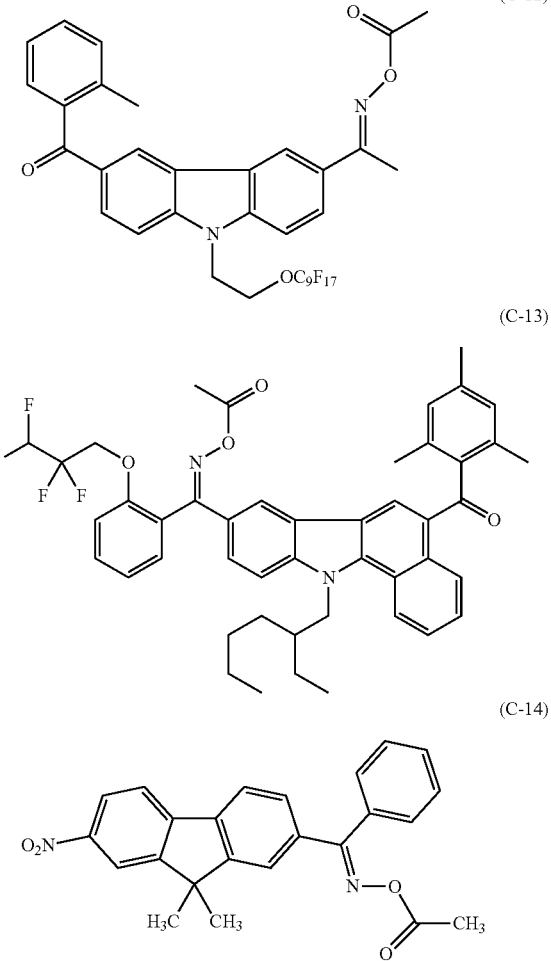

The oxime compound is preferably a compound having a maximum absorption wavelength in a wavelength range of 350 nm to 500 nm and more preferably a compound having a maximum absorption wavelength in a wavelength range of 360 nm to 480 nm. In addition, the oxime compound is preferably a compound having a high absorbance at 365 nm and 405 nm.

The molar absorption coefficient of the oxime compound at 365 nm or 405 nm is preferably 1000 to 300000, more preferably 2900 to 300000, and still more preferably 5000 to 200000 from the viewpoint of sensitivity.

The molar absorption coefficient of the compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

It is preferable that the photoradical polymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photoradical polymerization initiator is preferably 0.1 to 50 mass %, more preferably 0.5 to 30 mass %, and still more preferably 1 to 20 mass % with respect to the total solid content of the near infrared transmitting filter-forming composition. In a case where the content of the photoradical polymerization initiator is in the above-described range, higher sensitivity and pattern formability can be obtained. The near infrared transmitting filter-forming composition may include only one photoradical polymerization initiator or two or more photoradical polymerization initiators. In a case where the composition includes two or more photoradical polymerization initiators, it is preferable that the total content of the photoradical polymerization initiators is in the above-described range.

(Photocationic Polymerization Initiator)

Examples of the photocationic polymerization initiator include a photoacid generator. Examples of the photoacid generator include compounds which are decomposed by light irradiation to generate an acid including: an onium salt compound such as a diazonium salt, a phosphonium salt, a sulfonium salt, or an iodonitun salt; and a sulfonate compound such as imidosulfonate, oximesulfonate, diazodisulfone, disulfone, or o-nitrobenzyl sulfonate. The details of the photocationic polymerization initiator can be found in paragraphs "0139" to "0214" of JP2009-258603A, the content of which is incorporated herein by reference.

The content of the photocationic polymerization initiator is preferably 0.1 to 50 mass %, more preferably 0.5 to 30 mass %, and still more preferably 1 to 20 mass % with respect to the total solid content of the near infrared transmitting filter-forming composition. In a case where the content of the photocationic polymerization initiator is in the above-described range, higher sensitivity and pattern formability can be obtained. The near infrared transmitting filter-forming composition may include only one photocationic polymerization initiator or two or more photocationic polymerization initiators. In a case where the composition includes two or more photocationic polymerization initiators, it is preferable that the total content of the two or more photocationic polymerization initiators is in the above-described range.

<<Resin>>

It is preferable that the near infrared transmitting, filter-forming composition includes a resin. The resin is mixed, for example; in order to disperse the pigment and the like in the composition or to be used as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or a mixture of two or more kinds may be used. As the cyclic olefin resin, a norbornene resin can be preferably used from the viewpoint of improving heat resistance. Examples of a commercially available product of the norbornene resin include ARTON series (for example, ARTON F4520, manufactured by JSR Corporation). In addition, as the resin, a resin described in Examples of WO2016/088645A can also be used.

In the present invention, it is preferable that a resin having an acid group is used as the resin. According to this aspect, a pattern having excellent rectangularity can be easily formed. Examples of the acid group include a carboxyl group, a phosphate group, a sulfo group, and a phenolic hydroxyl group. Among these, a carboxyl group is preferable. The resin having an acid group can be used as, for example, an alkali-soluble resin.

As the resin having an acid group, a polymer having a carboxyl group at a side chain is preferable. Specific examples of the resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group at a side chain thereof, and a resin obtained by adding an acid anhydride to a polymer having a hydroxy group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinyl pyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, One kind may be used alone, or two or more kinds may be used in combination.

The resin having an acid group may further have a polymerizable group. Examples of the polymerizable group include an allyl group, a methallyl group, and a (meth) acryloyl group. Examples of a commercially available product of the resin include DIANAL NR series (manufactured by Mitsubishi Rayon Co., Ltd.), PHOTOMER 6173 (a carboxyl group-containing polyurethane acrylate oligomer; manufactured by Diamond Shamrock Co., Ltd.), VISCOAT R-264 and KS Resist 106 (both of which are manufactured by Osaka Organic Chemical Industry Ltd.), CYCLOMER P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic, acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer that includes a repeating unit derived from monomer components including a compound represented by the following Formula (ED1) and/or a compound represented by the following Formula (ED2) (hereinafter, these compounds, will also be referred to as "ether dimer") is also preferable.

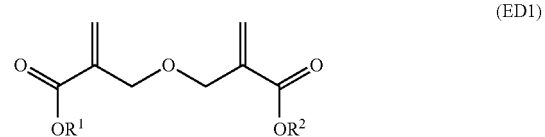

(ED1)

In Formula (ED1), $R^1$ and $R^2$ each independently represent a hydrogen atom or hydrocarbon group having 1 to 25 carbon atoms which may have a substituent.

(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph "0317" of JP2013-029760A, the content of which is incorporated herein by reference. Among these ether dimers, one kind may be used alone, or two or more kinds may be used in combination.

The resin having an acid group may include a repeating unit which is derived from a compound represented by the following Formula (X).

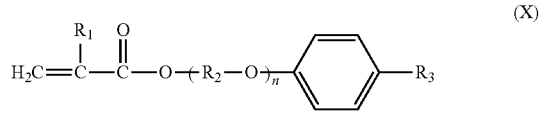

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin, having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin A used as the dispersant further includes a repeating unit having an acid group. By the resin, which is used as the dispersant, including the repeating unit having an acid group, in a case where a pattern is formed using a photolithography method, the amount of residues formed in an underlayer of a pixel can be reduced.

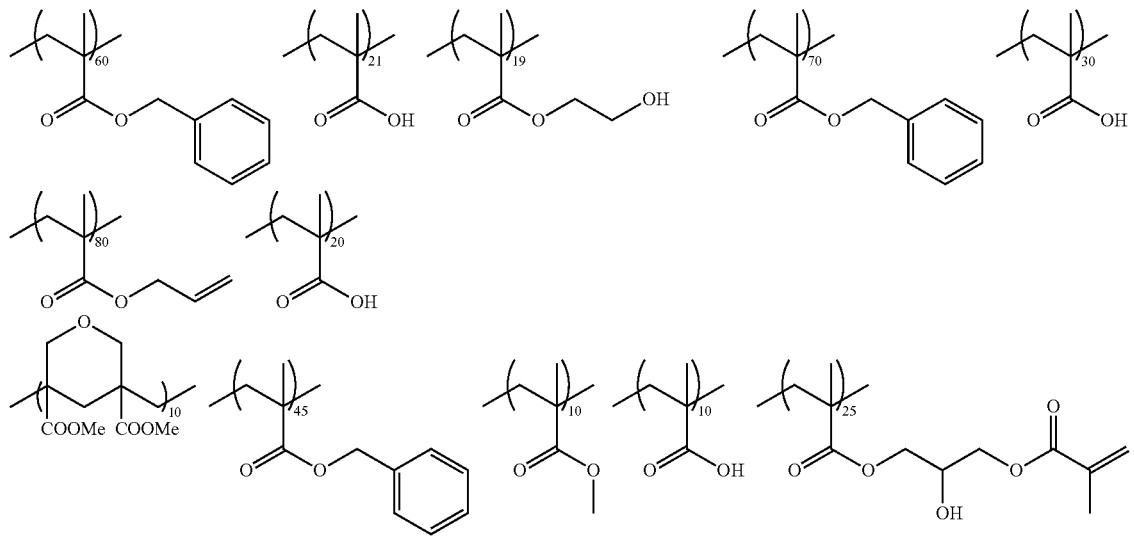

The near infrared transmitting filter-forming composition may include a resin as a dispersant. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference. In addition, specific examples of the graft copolymer include the following resins. The following resin may also be a resin having an acid group (alkali-soluble resin). In addition, other examples of the graft copolymer include resins described in paragraphs "0072" to "0094" of JP2012-255128A, the content of which is incorporated herein by reference.

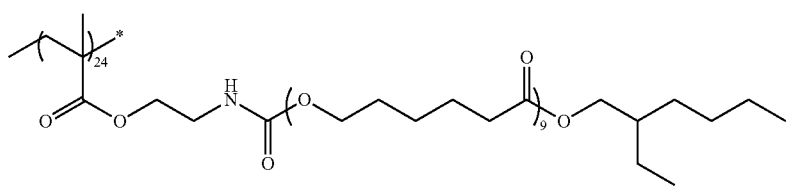

-continued

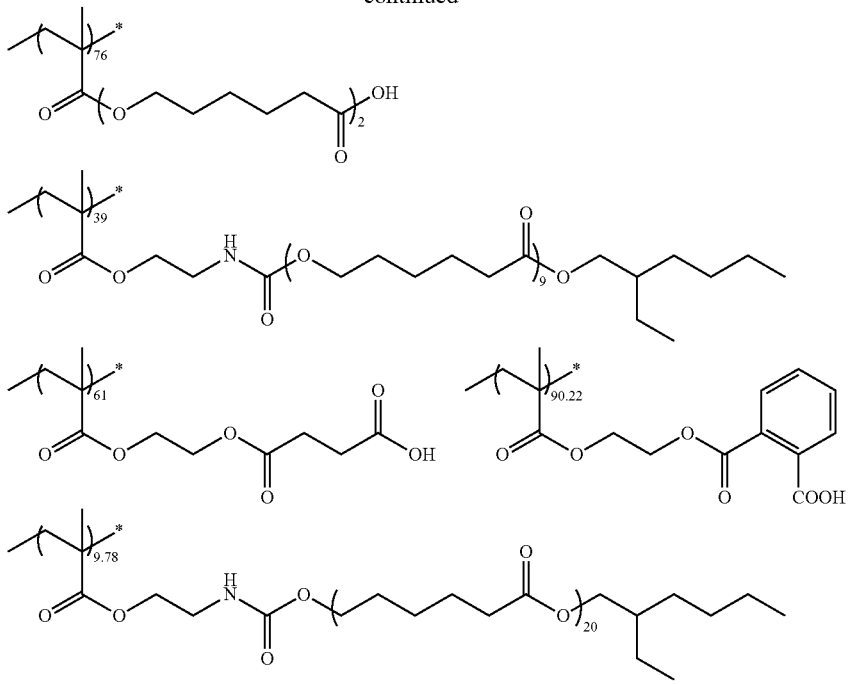

In addition, in the present invention, as the resin (dispersant), an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain including a side chain Y having 40 to 10000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs "0102" to "0166" of JP2012-255128A, the content of which is incorporated herein by reference. As the oligoimine dispersant, a resin having the following structure or a resin described in paragraphs "0168" to "0174" of JP2012-255128A can be used.

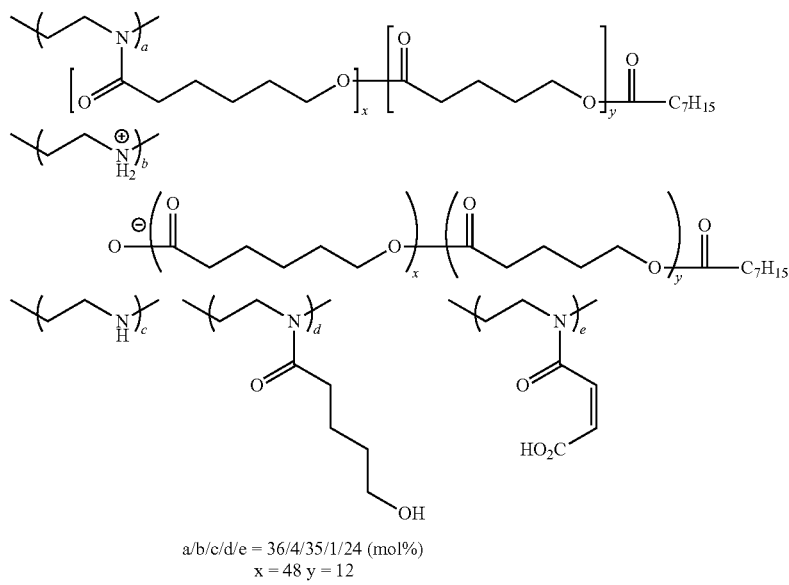

a/b/c/d/e = 36/4/35/1/24 (mol%)
x = 48 y = 12

The dispersant is available as a commercially available product, and specific examples thereof include Disperbyk-111 (manufactured by BYK Chemic). In addition, a pigment dispersant described in paragraphs "0041" to "0130" of JP2014-130338A can also be used, the content of which is incorporated herein by reference. In addition, the resin having an acid group or the like can also be used as a dispersant.

In a case where the near infrared transmitting filter-forming composition includes a resin, the content of the resin is preferably 14 to 70 mass % with respect to the total solid content of the near infrared transmitting filter-forming composition. The lower limit is preferably 17 mass % or higher and more preferably 20 mass % or higher. The upper limit is preferably 56 mass % or lower and more preferably 42 mass % or lower.

In a case where the near infrared transmitting filter-forming composition includes a resin having an acid group, the content of the resin having an acid group is preferably 14 to 70 mass % with respect to the total solid content of the near infrared transmitting filter-forming composition. The lower limit is preferably 17 mass % or higher and more preferably 20 mass % or higher. The upper limit is preferably 56 mass % or lower and more preferably 42 mass % or lower.

In a case where the near infrared transmitting filter-forming composition includes the radically polymerizable compound and the resin, a mass ratio radically polymerizable compound/resin of the radically polymerizable compound to the resin is preferably 0.4 to 1.4. The lower limit of the mass ratio is preferably 0.5 or higher and more preferably 0.6 or higher. The upper limit of the mass ratio is preferably 1.3 or lower and more preferably 1.2 or lower. In a case where the mass ratio is in the above-described range, a pattern having more excellent rectangularity can be formed.

In addition, it is preferable that a mass ratio radically polymerizable compound/resin having an acid group of the radically polymerizable compound to the resin having an acid group is 0.4 to 1.4. The lower limit of the mass ratio is preferably 0.5 or higher and more preferably 0.6 or higher. The upper limit of the mass ratio is preferably 1.3 or lower and more preferably 1.2 or lower. In a case where the mass ratio is in the above-described range, a pattern having more excellent rectangularity can be formed.

<<Pigment Derivative>>

The near infrared transmitting filter-forming composition may further include a pigment derivative. Examples of the pigment derivative include a compound having a structure in which a portion of a pigment is substituted with an acid group, a basic group, a group having a salt structure, or a phthalimidomethyl group. As the pigment derivative, a compound represented by Formula (B1) is preferable.

P-(-L-(X)$_n$)$_m$        (B1)

In Formula (B1), P represents a colorant structure, L represents a single bond or a linking group, X represents an acid group, a basic group, a group having a salt structure, or a phthalimidomethyl group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

In Formula (B1), P represents a colorant structure, preferably at least one selected from a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a pemylene colorant structure, a perinone colorant structure, a benzimidazolone colorant structure, a benzothiazole colorant structure, a benzimidazole colorant structure, or a benzoxazole colorant structure, more preferably at least one selected from a pyrrolopyrrole colorant structure, a diketo pyrrolopyrrole colorant structure, a quinacridone colorant structure, or a benzimidazolone colorant structure, and still more preferably a pyrrolopyrrole colorant structure.

In Formula (B1), L represents a single bond or a linking group. The linking group is preferably a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

In Formula (B1), X represents an acid group, a basic group, a group having a salt structure, or a phthalimidomethyl group. Among these, an acid group or a basic group is preferable. Examples of the acid group include a carboxyl group and a sulfo group. Examples of the basic group include an amino group.

Examples of the pigment derivative include compounds having the following structures. In addition, for example, compounds described in JP1981-118462A (JP-S56-118462A), JP1988-264674A (JP-S63-264674A), JP1989-217077A (JP-H1-217077A), JP1991-009961A (JP-H3-009961A), JP1991-026767A (JP-143-026767A), JP1991-153780A (JP-H3-153780A), JP1991-045662A (JP-H3-045662A), JP1992-285669A (JP-H4-285669A), JP1994-145546A (JP-H6-145546A), JP 1994-212088A (JP-H6-212088A), JP1994-240158A (JP-H6-240158A), JP1998-030063A (JP-H10-030063A), JP1998-195326A (J P-H10-195326A), paragraphs "0086" to "0098" of WO2011/024896A, and paragraphs "0063" to "0094" of WO2012/102399A can be used, the content of which is incorporated herein by reference.

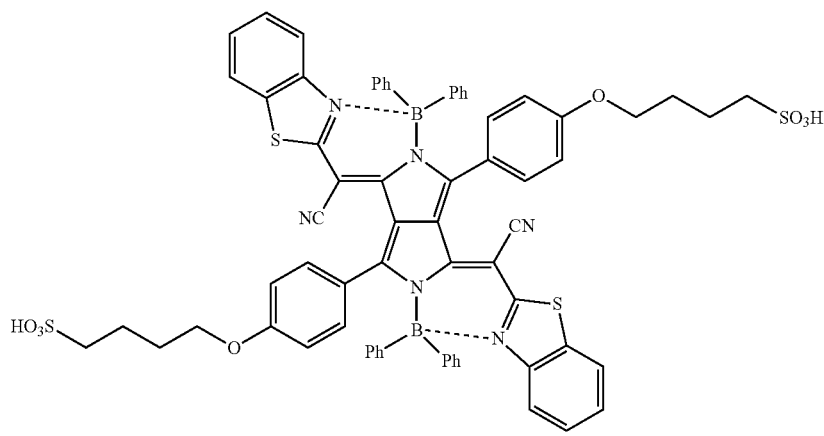

-continued
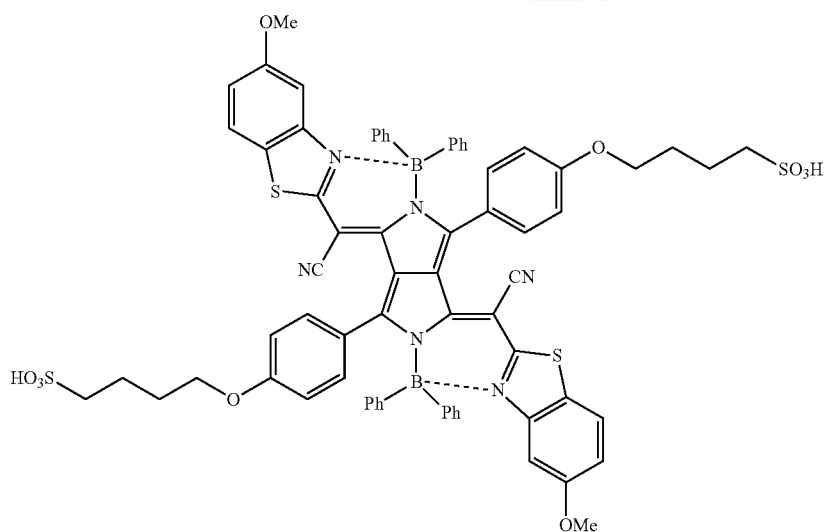
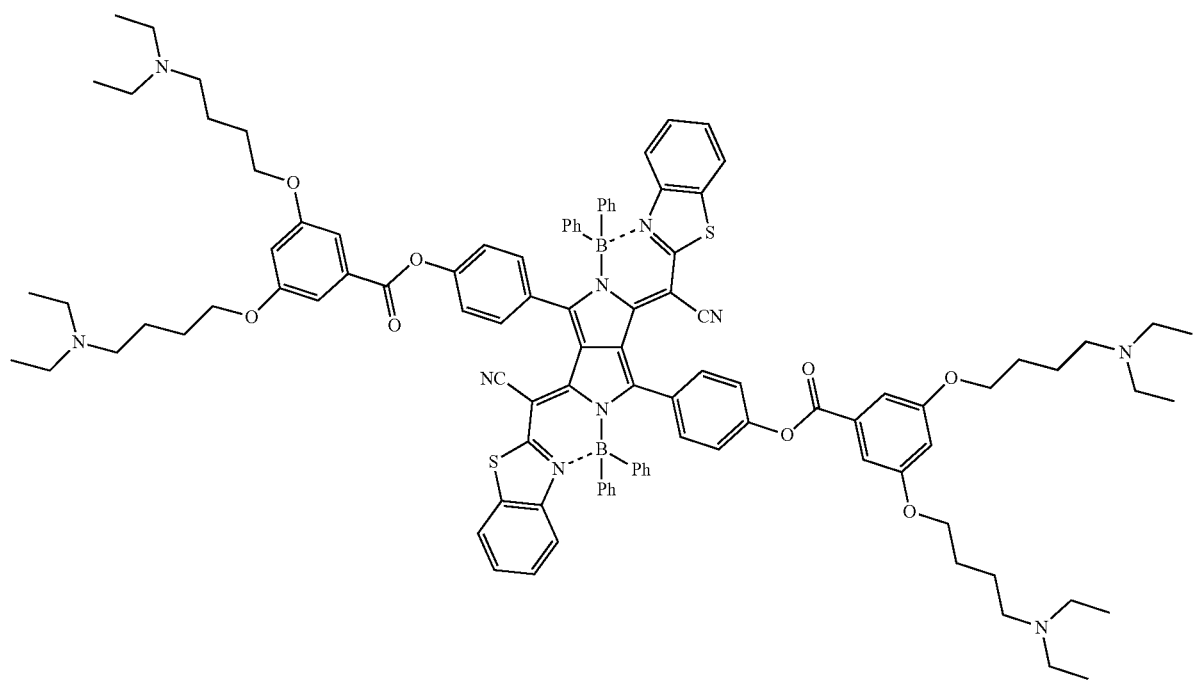

-continued

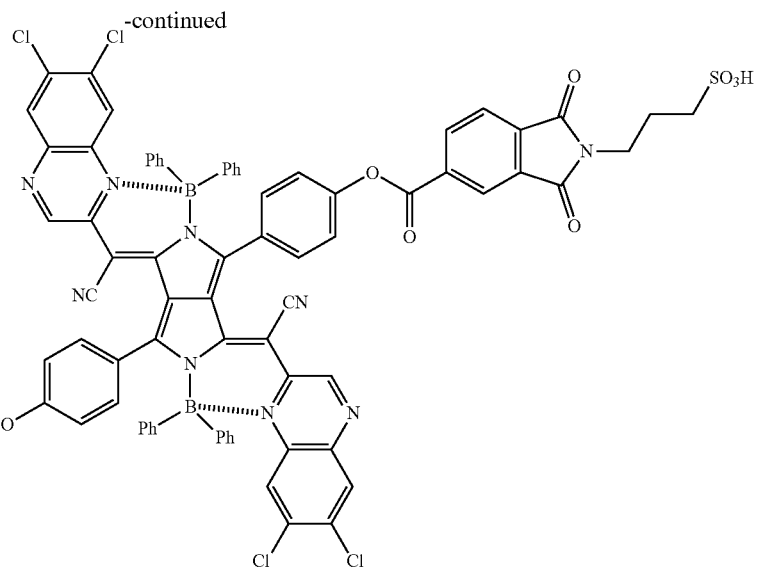

In a case where the near infrared transmitting filter-forming composition includes the pigment derivative, the content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the pigment dispersibility can be improved, and aggregation of the pigment can be effectively suppressed. As the pigment derivative, one kind may be used alone, or two or more kinds may be used in combination. In a case where two or more pigment derivatives are used in combination, it is preferable that the total content of the two or more pigment derivatives is in the above-described range.

<<Solvent>>

The near infrared transmitting filter-forming composition may further include a solvent. Examples of the solvent include an organic solvent. Basically, the solvent is not particularly limited as long as it satisfies the solubility of the respective components and the application properties of the composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 μm or less, more preferably 5 μm or less, and still more preferably 3 μm or less. As a material of the filter, polytetraflubroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass %, more preferably 20 to 80 mass %, and still more preferably 25 to 75 mass % with respect to the total mass of the near infrared transmitting filter-forming composition.

<<Polymerization Inhibitor>>

The near infrared transmitting filter-forming composition may further include a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable. The content of the polymerization inhibitor is preferably 0.001 to 5 mass % with respect to the total solid content of the near infrared transmitting filter-forming composition.

<<Silane Coupling Agent>>

The near infrared transmitting filter-forming composition may include a silane coupling agent. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a styryl group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the contents of which are incorporated herein by reference.

The content of the silane coupling, agent is preferably 0.01 to 15.0 mass % and more preferably 0.05 to 10.0 mass % with respect to the total solid content of the near infrared transmitting filter-forming composition. As the silane coupling agent, one kind may be used alone, or two or more kinds may be used. In a case where two or more antioxidants are used in combination, it is preferable that the total content of the two or more antioxidants is in the above-described range.

<<Surfactant>>

The near infrared transmitting filter-forming composition may include a surfactant. As the surfactants, various surfactants such as a fluorine surfactant, a nonionic surfactant, a cationic surfactant; an anionic surfactant, or a silicone surfactantcan be used. The details of the surfactant can be found in paragraphs "0238" to "0245" of WO2015/166779A, the content of which is incorporated herein by reference.

In the present invention, it is preferable that the surfactant is a fluorine surfactant. By the near infrared transmitting filter-forming composition including a fluorine surfactant, liquid characteristics (in particular, fluidity) are further improved, and liquid saving properties can be further improved. In addition, a film having reduced thickness unevenness can be formed.

The fluorine content in the fluorine surfactant is preferably 3 to 40 mass %, more preferably 5 to mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is, also excellent.

Specific examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

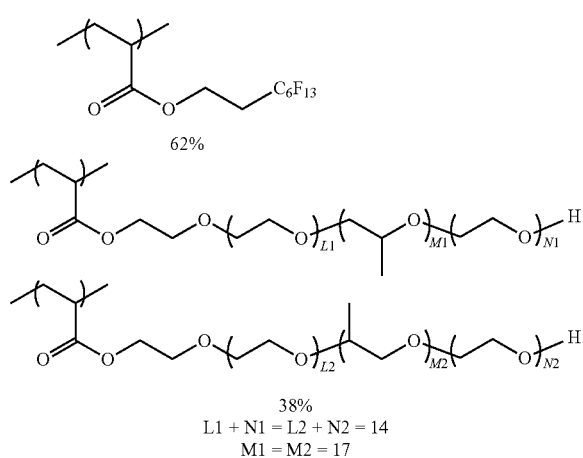

The weight-average molecular weight of the compound is preferably 3000 to 50,000 and, for example, 14000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

The content of the surfactant is preferably 0.001 to 5.0 mass % and more preferably 0.005 to 3.0 mass % with respect to the total solid content of the near infrared transmitting filter-forming composition. As the surfactant, one kind may be used alone, or two or more kinds may be used. In a case where two or more antioxidants are used in combination, it is preferable that the total content of the two or more antioxidants is in the above-described range.

<<Ultraviolet Absorber>>

The near infrared transmitting filter-forming composition may further include an ultraviolet absorber. As the ultraviolet absorber, for example, a conjugated diene compound, an aminobutadiene compound, a methyldibenzoyl compound, a coumarin compound, a salicylate compound, a benzophenone compound, a benzotriazole compound, an acrylonitrile compound, or a hydroxyphenyltriazine compound can be used. The details, can be found in paragraphs "0052" to "0072" of JP2012-208374A and paragraphs "0317" to "0334" of JP2013-068814A, the contents of which are incorporated herein by reference. Examples of a commercially available product of the conjugated diene compound include UV-503 (manufactured by Daito Chemical Co., Ltd.). In addition, as the benzotriazole compound, MYUA series (manufactured by Miyoshi Oil&Fat Co., Ltd.; The Chemical Daily, Feb. 1, 2016) may be used. As the ultraviolet absorber, a compound represented by any one of Formulae (UV-1) to (UV-3) is preferable, a compound represented by any one of Formula (UV-1) or (UV-3) is more preferable, and a compound represented by Formula (UV-1) is still more preferable.

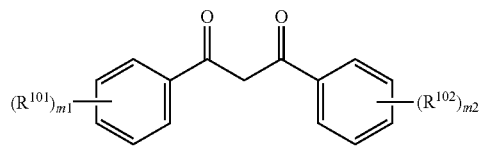

(UV-1)

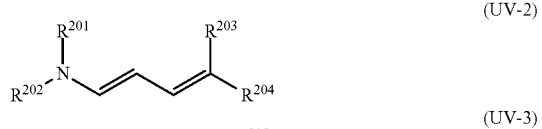

(UV-2)

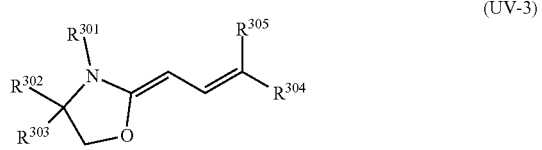

(UV-3)

In Formula (UV-1), $R^{101}$ and $R^{102}$ each independently represent a substituent, and m1 and m2 each independently represent 0 to 4.

In Formula (UV-2), $R^{201}$ and $R^{202}$ each independently represent a hydrogen atom or an alkyl group, and $R^{203}$ and $R^{204}$ each independently represent a substituent.

In Formula (UV-3), $R^{301}$ to $R^{303}$ each independently represent a hydrogen atom or an alkyl group, and $R^{304}$ and $R^{305}$ each independently represent a substituent.

Specific examples of the compounds represented by Formulae (UV-1) to (UV-3) include the following compounds.

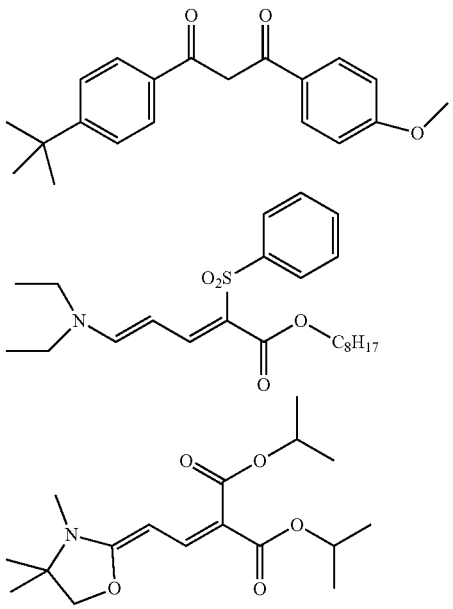

In the near infrared transmitting filter-forming composition, the content of the ultraviolet absorber is preferably 0.01 to 10 mass % and more preferably 0.01 to 5 mass % with respect to the total solid content of the near infrared transmitting filter-forming composition. In the present invention, as the ultraviolet absorber, one kind may be used alone, or two or more kinds may be used. In a case where two or more ultraviolet absorbers are used in combination, it is preferable that the total content of the two or more ultraviolet absorbers is in the above-described range.

<<Antioxidant>>

The near infrared transmitting filter-forming composition may further include an antioxidant. Examples of the antioxidant include a phenol compound, a phosphite compound, and a thioether compound. As the phenol compound, any phenol compound which is known as a phenol antioxidant can be used. As the phenol compound, for example, a hindered phenol compound is preferable. A compound having a substituent at a position (ortho position) adjacent to a phenolic hydroxyl group is preferable. As the substituent, a substituted or unsubstituted alkyl group having 1 to 22 carbon atoms is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo [d,f][1,3,2]dioxaphosphepin-2-yl)oxy]ethyl]amine, and ethyl bis(2,4-di-tert-butyl-6-methylphenyl)phosphite. Examples of the commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation).

In the composition according to the embodiment of the present invention, the content of the antioxidant is preferably 0.01 to 20 mass % and more preferably 0.3 to 15 mass % with respect to the total solid content of the near infrared transmitting filter-forming composition. As the antioxidant, one kind may be used alone, or two or more kinds may be used in combination. In a case where two or more antioxidants are used in combination, it is preferable that the total content of the two or more antioxidants is in the above-described range.

<<Other Components>>

Optionally, the near infrared transmitting filter-forming composition may further include a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an aromatic chemical, a surface tension adjuster, or a chain transfer agent). By the curable composition appropriately including the components, properties such as film properties can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the contents of which are incorporated herein by reference.

For example, in a case where a film is formed by coating, the viscosity (23° C.) of the near infrared transmitting filter-forming composition is preferably 1 to 100 mPa·s. The lower limit is more preferably 2 mPa·s or higher and still more preferably 3 mPa·s or higher. The upper limit is more preferably 50 mPa·s or lower, still more preferably 30 mPa·s or lower, and still more preferably 15 mPa·s or lower.

<Color Filter-Forming Composition>

Next, a composition (color filter-forming composition) that can be preferably used for forming the color filter in the structure according to the embodiment of the present invention will be described. It is preferable that the color filter-forming composition includes a chromatic colorant. As the chromatic colorant, a pigment or a dye may be used. The details of the chromatic colorant are as described above. The content of the chromatic colorant is preferably 0.1 to 70 mass % with respect to the total solid content of the color filter-forming composition. The lower limit is preferably 0.5 mass % or higher and more preferably 1.0 mass % or higher. The upper limit is preferably 60 mass % or lower, and more preferably 50 mass % or lower.

The color filter-forming composition further includes, for example, a curable compound, a photoinitiator, a resin, a solvent, a polymerization inhibitor, a surfactant, a silane coupling agent, an ultraviolet absorber, or an antioxidant. The details of the examples can be found in the description of the above-described materials used in the near infrared transmitting filter-forming composition, and preferable ranges thereof are also the same. In addition, the preferable contents of the materials are the same as those of the near infrared transmitting filter-forming composition.

<Near Infrared Cut Filter-Forming Composition>

Next, a composition (near infrared cut filter-forming composition) that can be preferably used for forming the near infrared cut filter will be described. It is preferable that the near infrared cut filter-forming composition may further include a near infrared absorber. The details of the near infrared absorber are as described above. The content of the near infrared absorber is preferably 0.1 to 70 mass % with respect to the total solid content of the near infrared cut filter-forming composition. The lower limit is preferably 0.5 mass % or higher and more preferably 1.0 mass % or higher. The upper limit is preferably 60 mass % or lower, and more preferably 50 mass % or lower.

The near infrared cut filter-forming composition further includes, for example, a curable compound, a photoinitiator, a resin, a solvent, a polymerization inhibitor, a surfactant, a silane coupling agent, an ultraviolet absorber, or an antioxidant. The details of the examples can be found in the description of the above-described materials used in the near infrared transmitting filter-forming composition, and preferable ranges thereof are also the same. In addition, the preferable contents of the materials are the same as those of the near infrared transmitting filter-forming composition.

<Storage Container>

A storage container of each of the compositions is not particularly limited, and a well-known storage container can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

<Method of Preparing Each of Compositions>

Each of the compositions can be prepared by mixing the above-described components with each other. During the preparation of the composition, all the components may be dissolved or dispersed in a solvent at the same time to prepare each of the compositions. Optionally, two or more solutions or dispersions to which the respective components are appropriately added may be prepared, and the solutions or dispersions may be mixed with each other during use (during application) to prepare each of the compositions.

<Method of Manufacturing Structure>

Next, a method of manufacturing the structure according to the embodiment of the present invention will be described. The structure according to the embodiment of the present invention can be manufactured through a step of applying the near infrared transmitting filter-forming composition to a support to form a near infrared transmitting filter.

Examples of the support include the support described above regarding the above-described structure. As a method of applying the near infrared transmitting filter-forming composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic, printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent-" (February, 2005, S.B. Research Co., Ltd.) and methods described in JP2003-

262716A, JP2003-185831A, JP2003-261827A, JP2012-126830A, and JP2006-169325A.

A composition layer formed by applying the near infrared transmitting filter-forming composition may be dried (pre-baked). In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. The pre-baking time is preferably 10 to 3000 seconds, more preferably 40 to 2500 seconds, and still more preferably 80 to 220 seconds. Pre-baking can be performed using a hotplate, an oven, or the like.

During the formation of the near infrared transmitting filter, a step of forming a pattern may be further provided. Examples of a pattern forming method include a pattern forming method using a photolithography method and a pattern forming method using a dry etching method. Hereinafter, the step of forming a pattern will be described in detail.

(Case where Pattern is Formed Using Photolithography Method)

It is preferable that the pattern forming method using a photolithography method includes: a step (exposure step) of exposing the composition layer on the support in a pattern shape; and a step (development step) of forming a pattern by removing a non-exposed portion of the composition layer by development. Optionally, the pattern forming method may further include a step (post-baking step) of baking the developed pattern. Hereinafter, the respective steps will be described.

<<Exposure Step>>

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, ultraviolet rays such as g-rays or i-rays are preferable, and i-rays are more preferable. For example, the irradiation dose (exposure dose) is preferably 0.03 to 2.5 $J/cm^2$, more preferably 0.05 to 1.0 $J/cm^2$, and most preferably 0.08 to 0.5 $J/cm^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 $W/m^2$ to 100000 $W/m^2$ (for example, 5000 $W/m^2$, 15000 $W/m^2$, or 35000 $W/m^2$). Conditions of the oxygen concentration and conditions of the exposure illuminance may be appropriately combined. For example, conditions are oxygen concentration: 10 vol % and illuminance: 10000 $W/m^2$, oroxygen concentration: 35 vol % and illuminance: 20000 $W/m^2$.

<<Development Step>>

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photo-cured portion remains on the support. As the developer, an alkali developer which does not cause damages to a solid image pickup element as an underlayer, a circuit or the like is desired. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. From the viewpoints of environment and safety, it is preferable that the alkaline agent is a compound having a high molecular weight. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. In addition, a surfactant may be used as the developer. Examples of the surfactant include the above-described surfactants: Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 50° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature, is preferably 150° C. or lower, more preferably 120° C. or lower, still more preferably 100° C. or lower, and still more preferably 90° C. or lower. The film after the development is post-baked continuously or batch-wise using heating means such as a hot plate, a convection oven (hot air circulation dryer), a high frequency heater under the above-described conditions.

(Case where Pattern is Formed Using Dry Etching Method)

The formation of a pattern using a dry etching method can be performed using a method including: curing the composition layer on the support to form a cured composition layer; forming a patterned photoresist layer on the cured composition layer; and dry-etching the cured composition layer with etching gas by using the patterned photoresist layer as a mask. It is preferable that pre-baking is further performed in order to form the photoresist layer. In particular, in a preferable aspect, as a process of forming the photoresist layer, baking after exposure or baking after development (post-baking) is performed. The details of the pattern formation using the dry etching method can be found in paragraphs "0010" to "0067" of JP2013-064993A, the content of which is incorporated herein by reference.

By performing the above-described step on each of the near infrared transmitting filters, the structure according to the embodiment of the present invention can be manufactured. In addition, in a case where the structure according to the embodiment of the present invention further includes another filter layer such as a color filter or a near infrared cut filter, the structure can be manufactured by performing a step described above regarding the step of forming the near infrared transmitting filter using the composition for forming each of the filter layers.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

<Preparation of Pigment Dispersion>

Raw materials shown in the following table were mixed with each other, 230 parts by mass of zirconia beads having a diameter of 0.3 mm were further added to the mixture, and the solution was dispersed using a paint shaker for 5 hours. Next, the beads were separated by filtration. As a result, a dispersion was manufactured.

TABLE 1

|  | Coloring Material, Near Infrared Absorber | | Dispersing Auxiliary Agent (Derivative, Resin) | | Dispersant | | Solvent | |
| --- | --- | --- | --- | --- | --- | --- | --- | --- |
|  | Kind | Part(s) by Mass | Kind | Part(s) by Mass | Kind | Part(s) by Mass | Kind | Part(s) by Mass |
| Pigment Dispersion R-1 | PR254 | 12.59 |  |  | C1 | 4.4 | J1 | 83.01 |
| Pigment Dispersion R-2 | PR254 | 12.59 |  |  | C3 | 4.4 | J1 | 83.01 |
| Pigment Dispersion B-1 | PB15:6 | 12.59 |  |  | C2 | 4.4 | J1 | 83.01 |
| Pigment Dispersion B-2 | PB15:6 | 12.59 |  |  | C3 | 4.4 | J1 | 83.01 |
| Pigment Dispersion Y-1 | PY139 | 11.00 | B1 | 1.59 | C2 | 4.4 | J1 | 83.01 |
| Pigment Dispersion Y-2 | PY139 | 11.00 | B1 | 1.59 | C3 | 4.4 | J1 | 83.01 |
| Pigment Dispersion V-1 | PV23 | 14.20 | P1 | 2 | C4 | 3.8 | J1 | 73.01 |
|  |  |  |  |  |  |  | J2 | 10.00 |
| Pigment Dispersion IR-1 | A1 | 11.00 | B2 | 1.59 | C3 | 4.4 | J1 | 83.01 |
| Pigment Dispersion IR-2 | A1 | 11.00 | B3 | 1.59 | C1 | 4.4 | J1 | 83.01 |
| Pigment Dispersion Bk-1 | Irgaphor Black | 12.59 |  |  | C2 | 4.4 | J1 | 83.01 |
| Pigment Dispersion Bk-2 | Pigment Black 32 | 12.59 |  |  | C2 | 4.4 | J1 | 83.01 |

<Preparation of Near Infrared Transmitting Filter-Forming Composition (IR Transmitting Composition)>

Raw materials shown in the following tables were mixed with each other to prepare an IR transmitting composition.

TABLE 2

|  |  | IR Transmitting Composition 1-1 | IR Transmitting Composition 2-1 | IR Transmitting Composition 2-2 | IR Transmitting Composition 2-3 | IR Transmitting Composition 2-4 | IR Transmitting Composition 3-1 | IR Transmitting Composition 3-2 | IR Transmitting Composition 3-3 | IR Transmitting Composition 3-4 | IR Transmitting Composition 3-5 |
|---|---|---|---|---|---|---|---|---|---|---|---|
| Pigment Dispersion | R-1 |  | 19.09 |  |  | 21 |  | 25.48 | 25.48 |  | 25.58 |
|  | R-2 |  |  |  |  |  | 25.48 |  |  |  |  |
|  | B-1 |  | 29.32 | 13.5 | 13.5 | 32.26 |  | 25.48 | 25.48 | 12.74 |  |
|  | B-2 |  |  |  |  |  | 25.48 |  |  |  | 25.78 |
|  | Y-1 | 23.79 | 11.59 | 13.5 |  | 12.75 |  | 12.74 | 12.74 | 12.74 | 12.74 |
|  | Y-2 |  |  |  | 13.5 |  | 12.74 |  |  |  |  |
|  | V-1 | 41.43 | 6.65 |  |  | 7.32 |  |  |  |  |  |
|  | IR-1 |  |  |  |  |  | 14.14 |  |  |  |  |
|  | IR-2 |  |  |  |  |  |  | 14.14 |  |  |  |
|  | Bk-1 |  |  |  | 40.51 |  |  |  |  |  |  |
|  | Bk-2 |  |  | 40.51 |  |  |  |  |  | 38.92 |  |
| Near Infrared Absorbing Compound | A8 |  |  |  |  |  |  |  | 1.79 |  |  |
|  | A12 |  |  |  |  |  |  |  |  | 1.98 |  |
|  | A5 |  |  |  |  |  |  |  |  |  | 1.79 |
| Curable Compound | D1 | 0.91135 |  |  | 2.1 |  |  |  | 2.98 |  |  |
|  | D2 | 2.12 |  | 2.085 |  | 1.877 |  |  |  | 2.482 |  |
|  | D3 |  | 2.085 |  |  |  |  | 2.482 |  |  |  |
|  | D4 |  |  |  |  |  | 2.482 |  |  |  | 2.68 |
| Photo-initiator | I1 | 0.743 |  | 1.2 |  |  |  |  | 1.112 | 1.012 |  |
|  | I2 |  |  |  |  | 1.081 | 1.012 |  |  |  |  |
|  | I3 |  | 1.201 |  | 1.18 |  |  | 1.012 |  |  |  |
|  | I4 |  |  |  |  |  |  |  |  |  | 1.082 |
| Resin | P1 |  | 2.18 | 2.24 |  |  |  | 2.77 | 3.39 | 3.39 | 3.42 |
|  | P2 | 1.379 |  |  |  | 1.36 |  |  |  |  |  |
|  | P3 |  |  |  | 2.24 |  | 2.77 |  |  |  |  |
| UV Absorber | UV1 | 0.407 |  |  |  |  |  |  |  |  |  |
| Surfactant | F1 | 0.008 | 0.042 | 0.042 | 0.042 | 0.042 | 0.04 | 0.04 | 0.04 | 0.04 | 0.04 |
| Polymerization inhibitor | G1 | 0.00152 | 0.01 | 0.01 | 0.01 | 0.001 | 0.001 | 0.001 | 0.001 | 0.001 | 0.001 |
| Solvent | J1 | 29.21 | 27.827 | 26.922 | 26.922 | 22.314 | 15.9 | 15.9 | 26.97 | 26.77 | 26.97 |

<Preparation of Near Infrared Cut Filter-Forming Composition (IR Absorbing Composition)>

Raw materials shown in the following tables were mixed with each other to prepare an IR absorbing composition. In the photosensitive composition in which a dispersion was used as a raw material, the dispersion was prepared as follows.

An near infrared absorber, a derivative, a dispersant, and a solvent described in "Dispersion" of the following tables were mixed with each other in part(s) by mass shown in "Dispersion" of the following tables, 230 parts by mass of zirconia beads having a diameter of 0.3 mm was further added thereto, the mixture was dispersed using a paint shaker for 5 hours, and the beads were separated by filtration. As a result, a dispersion was manufactured.

TABLE 3

|  | Dispersant | | | | | | | | Near Infrared Absorber | | Resin | | Curable Compound | |
|---|---|---|---|---|---|---|---|---|---|---|---|---|---|---|
|  | Near Infrared Absorber | | Derivative | | Dispersant | | Solvent | | | | | | | |
|  | No. | Part(s) by Mass | No. | Part(s) by Mass | No. | Part(s) by Mass | No. | Part(s) by Mass | No. | Part(s) by Mass | No. | Part(s) by Mass | No. | Part(s) by Mass |
| IR Absorbing Composition 1 | A1 | 2.5 | B2 | 0.5 | C3 | 1.8 | J1 | 39 | — |  | P1 | 5.5 | D3 | 0.64 |
|  |  |  |  |  |  |  |  |  |  |  |  |  | D4 | 5.76 |
| IR Absorbing Composition 2 | A2 | 2.5 | B4 | 0.5 | C3 | 1.8 | J1 | 39 | — |  | P1 | 5.5 | D5 | 3.2 |
|  |  |  |  |  |  |  |  |  |  |  |  |  | D4 | 3.2 |

TABLE 3-continued

| | Photo-initiator | | Ultraviolet Absorber | | Surfactant | | Polymerization Inhibitor | | Antioxidant | | Solvent | |
|---|---|---|---|---|---|---|---|---|---|---|---|---|
| | No. | Part(s) by Mass | No. | Part(s) by Mass | No. | Part(s) by Mass | No. | Part(s) by Mass | No. | Part(s) by Mass | No. | Part(s) by Mass |
| IR Absorbing Composition 1 | I5 | 1 | UV2 | 1.6 | F1 | 0.025 | G1 | 0.003 | AO1 | 0.2 | J1 | 41.472 |
| IR Absorbing Composition 2 | I5 | 1 | UV3 | 1.6 | F1 | 0.025 | G1 | 0.003 | AO1 | 0.2 | J1 | 41.472 |
| IR Absorbing Composition 3 | I5 | 1 | UV3 | 1.6 | F1 | 0.025 | G1 | 0.003 | AO1 | 0.2 | J1 | 80.472 |

(Note: for IR Absorbing Composition 3, Table 3 also shows A10 1, A11 1, A12 1, P1 7.3, D5 3.2, D4 3.2)

The raw materials shown above in the table are as follows.
(Coloring Material)
PR254: C.I. Pigment Red 254
PB 15:6: C.I. Pigment Blue 15:6
PY139: C.I. Pigment Yellow 139
PV23: C.I. Pigment Violet 23
Irgaphor Black: IRGAPHOR BLACK (manufactured by BASF SE)
Pigment Black 32: C.I. Pigment Black 32
(Near Infrared Absorber)
A1, A2, A5: compounds having the following structures:
In the following formulae, Me represents a methyl group, and Ph represents a phenyl group.

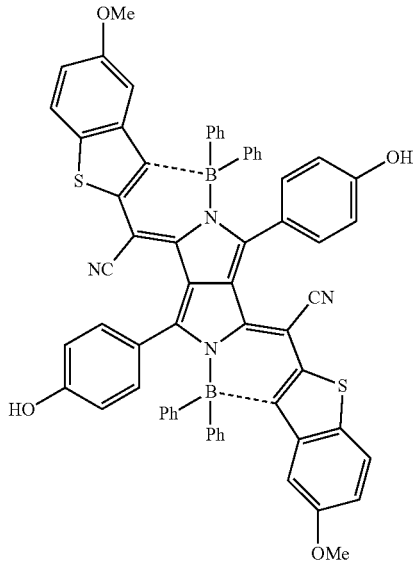

(A1)

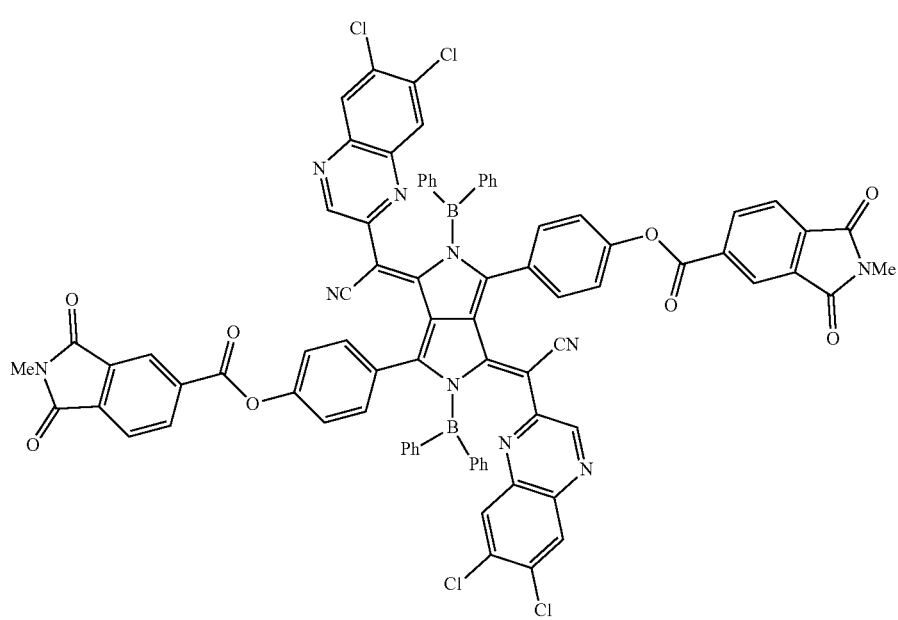
(A2)
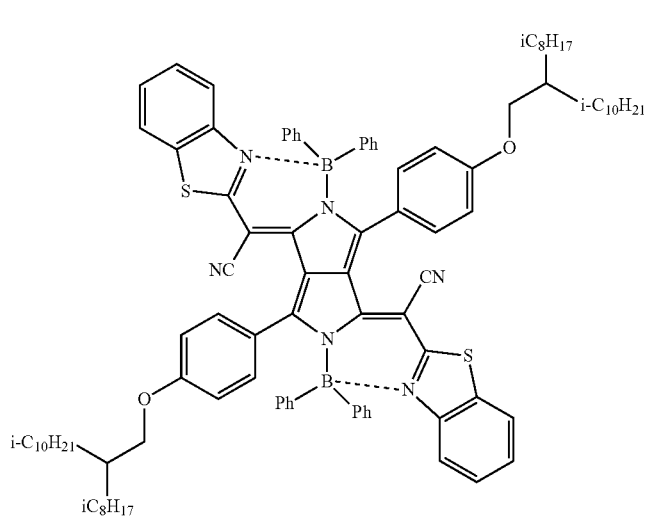
(A5)
A8: a compound 31 described in paragraph "0051" of JP2008-088426A
A10: a compound a-1 described in paragraph "0173" of JP2016-146619A
A11: a compound a-2 described in paragraph "0173" of JP2016-146619A
A12: a compound a-3 described in paragraph "0173" of JP2016-146619A
(Derivative)
B1 to B4: compounds having the following structures. In the following structural formulae, Ph represents a phenyl group.

(B1)
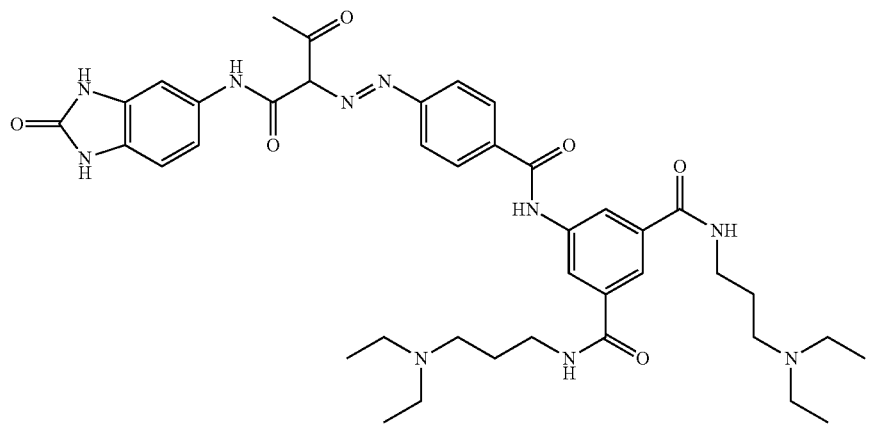
(B2)
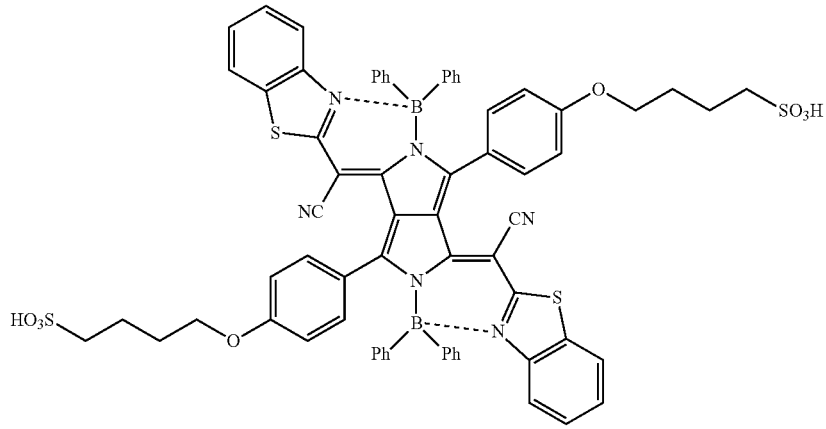
(B3)
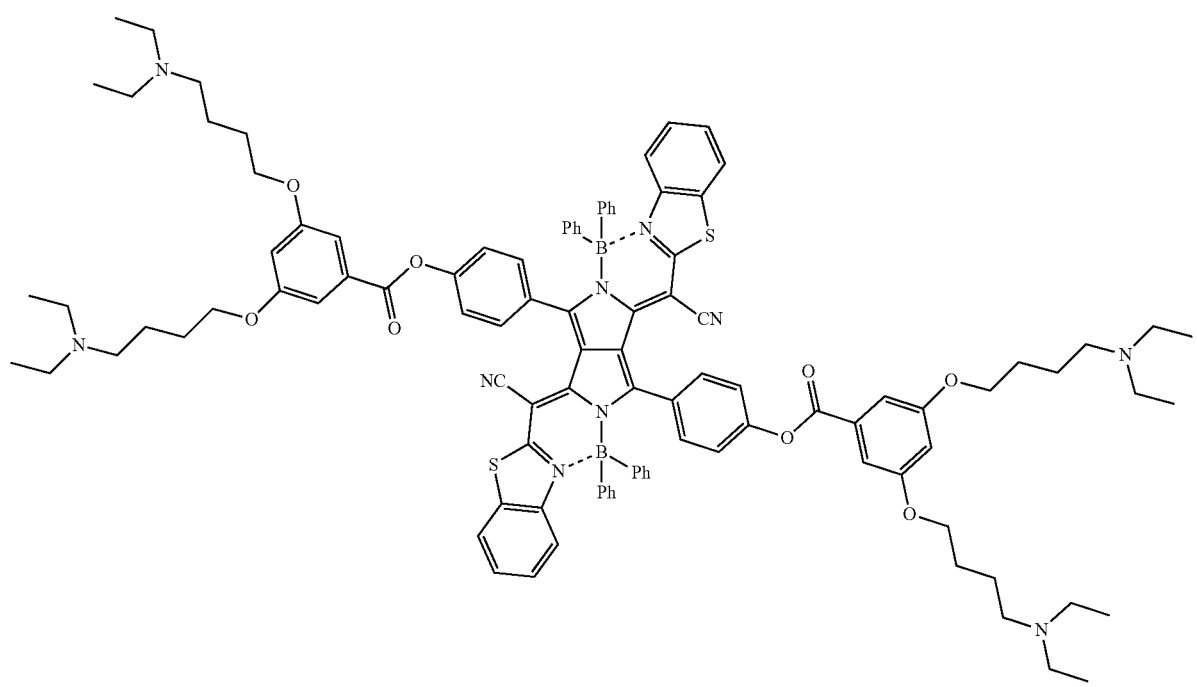

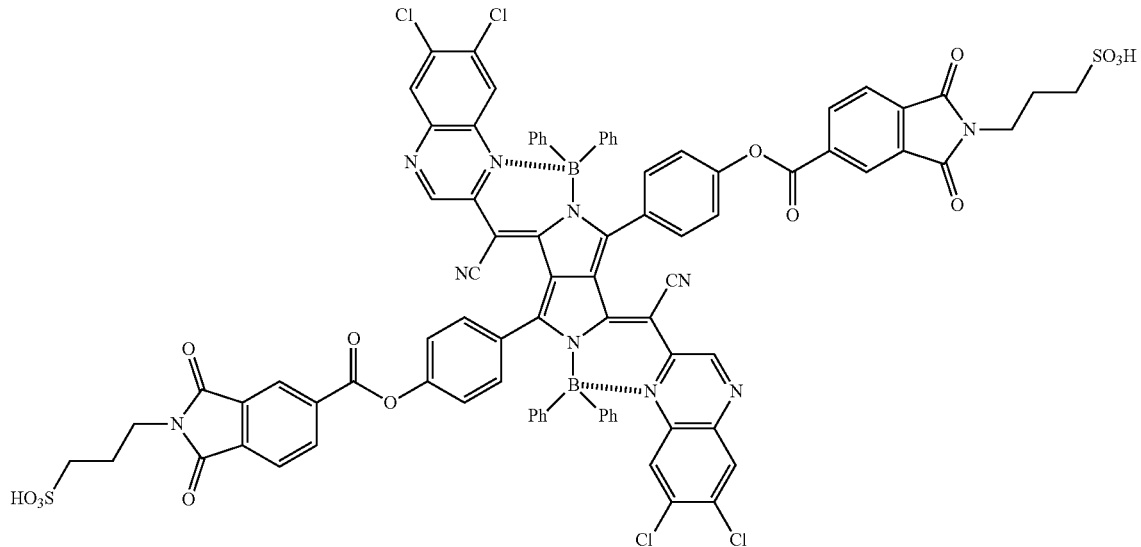
(B4)

25

(Dispersant)

C1: a resin having the following structure (a numerical value added to a main chain represents a molar ratio, and a numerical value added to a side chain represents the number of repeating units; Mw=21000)

C2: a resin having the following structure (a numerical value added to a main chain represents a molar ratio, and a numerical value added to a side chain represents the number of repeating, units; Mw=26000)

C3: a resin having the following structure (a numerical value added to a main chain represents a molar ratio, and a numerical value added to a side chain represents the number of repeating units; Mw=21000)

C4: Disperbyk-111 (manufactured by BYK Chemie)

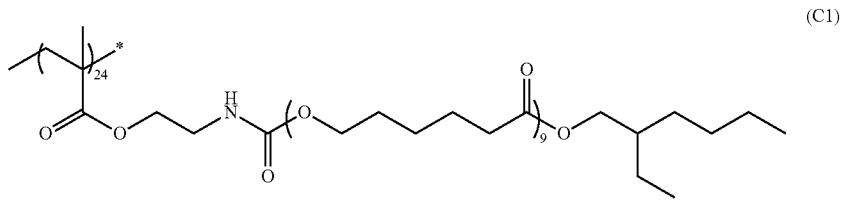
(C1)

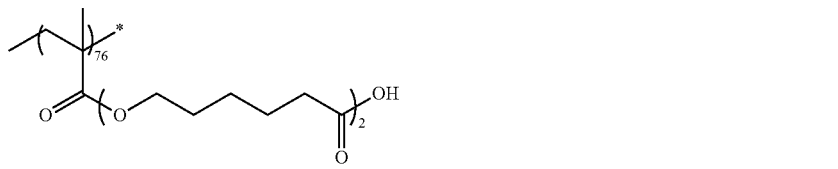

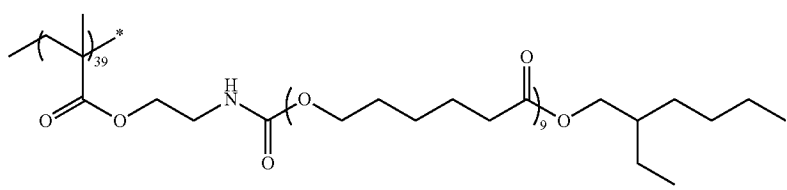
(C2)

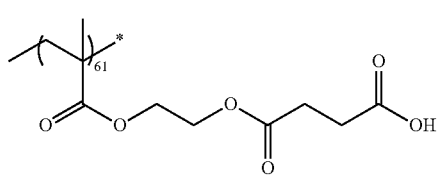

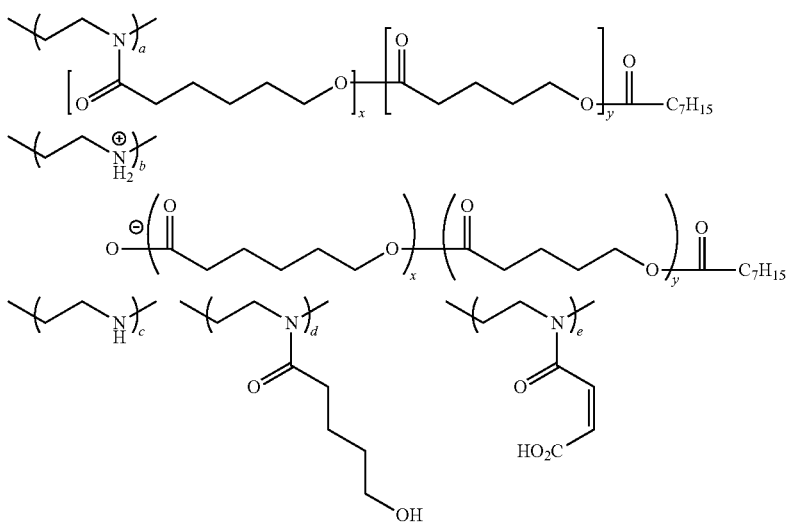

a/b/c/d/e = 36/4/35/1/24 (mol%)
x = 48 y = 12

(Resin)

P1: a resin having the following structure (a numerical value added to a main chain represents a molar ratio; Mw=10000, acid value=70 mgKOH/g)

P2: a resin having the following structure (a numerical value added to a main chain represents a molar ratio; Mw=10000, acid value=70 mgKOH/g)

P3: a resin having the following structure (a numerical value added to a main chain represents a molar ratio; Mw=40000, acid value=100 mgKOH/g)

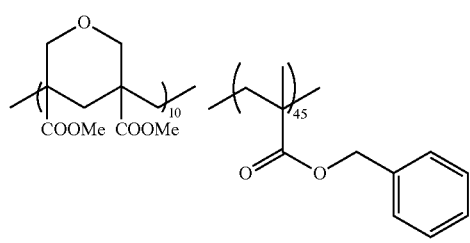

(P1)

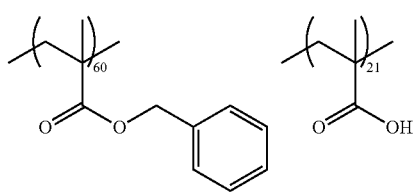

(P2)

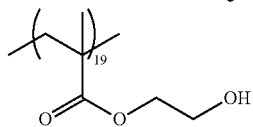

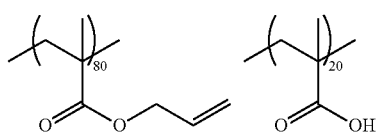

(P3)

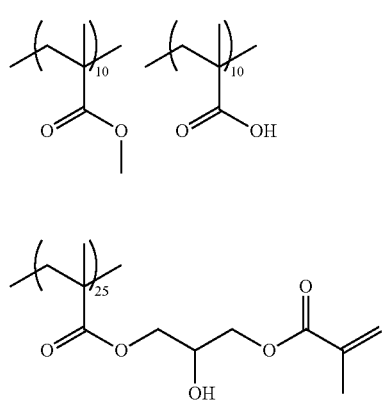

(Curable Compound)

D1: KAYARAD RP-1040 (manufactured by Nippon Kayaku Co., Ltd., radically polymerizable compound)

D2: ARONIX TO-2349 (manufactured by Toagosei Co., Ltd., radically polymerizable compound)

D3: ARONIX M-305 (manufactured by Toagosei Co., Ltd., radically polymerizable compound)

D4: NK ESTER A-TMMT (manufactured by Shin-Nakamura Chemical Co., Ltd., radically polymerizable compound)

D5: KAYARAD DPHA (manufactured by Nippon Kayaku Co., Ltd., radically polymerizable compound)

(Photoinitiator)

I1: IRGACURE OXE02 (manufactured by BASF SE, photoradical polymerization initiator)

I2: IRGACURE OXE03 (manufactured by BASF SE, photoradical polymerization initiator)

I3: IRGACURE OXE04 (manufactured by BASF SE, photoradical polymerization initiator)

I4: IRGACURE 369 (manufactured by BASF SE, photoradical polymerization initiator)

I5: IRGACURE OXE01 (manufactured by BASF SE, photoradical polymerization initiator)

(Ultraviolet Absorber)

UV1: UV-503 (manufactured by Daito Chemical Co., Ltd.)

UV2 and UV3: compounds having the following structures

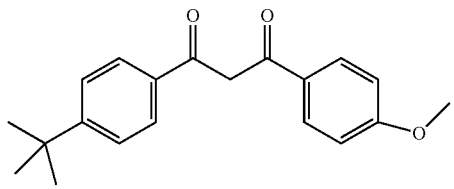

(UV2)

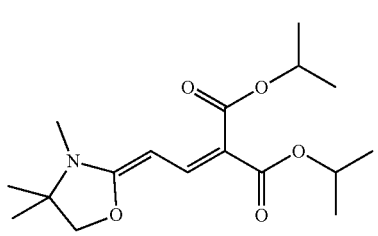

(UV3)

(Surfactant)

F1: the following mixture (Mw=14000, in the following formula, "%" representing the proportion of a repeating unit is mol %)

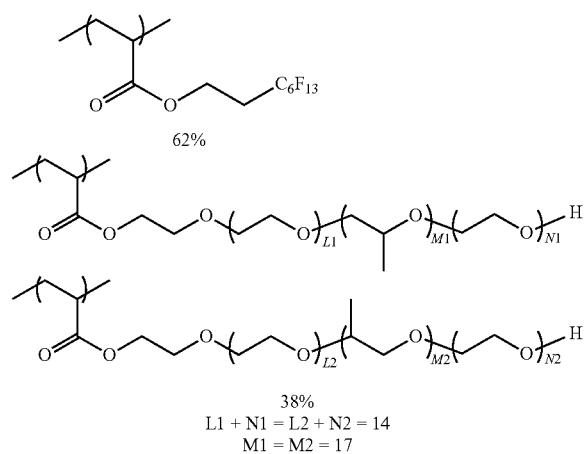

L1 + N1 = L2 + N2 = 14
M1 = M2 = 17

(Polymerization Inhibitor)
G1: p-methoxyphenol
(Antioxidant)
AO1: ADEKA STAB AO-80 (manufactured by Adeka Corporation)
(Solvent)
J1: propylene glycol monomethyl ether acetate (PGMEA)
J2: cyclohexanone <Preparation of Color Filter-Forming Composition>

(Red Composition 1)

The following raw materials were mixed and stirred, and the obtained mixture was filtered through a nylon filter (manufactured by Pall Corporation) having a pore size of 0.45 μm to prepare a Red composition 1.

| | |
|---|---|
| Red Pigment Dispersion | 51.7 parts by mass |
| 40 mass % PGMEA solution of resin 1 | 0.6 parts by mass |
| Curable compound 1 | 0.6 parts by mass |
| Photoinitiator 1 | 0.3 parts by mass |
| 0.2 mass % PGMEA solution of surfactant 1 | 4.2 parts by mass |
| PGMEA | 42.6 parts by mass |

(Green Composition 1)

The following raw materials were mixed and stirred, and the obtained mixture was filtered through a nylon filter (manufactured by Pall Corporation) having a pore size of 0.45 μm to prepare a Green composition 1.

| | |
|---|---|
| Green Pigment Dispersion | 73.7 parts by mass |
| 40 mass % PGMEA solution of resin 1 | 0.3 parts by mass |
| Curable compound 2 | 1.2 parts by mass |
| Photoinitiator 1 | 0.6 parts by mass |
| 0.2 mass % PGMEA solution of surfactant 1 | 4.2 parts by mass |
| Ultraviolet Absorber 1 | 0.5 parts by mass |
| PGMEA | 19.5 parts by mass |

(Blue Composition 1)

The following raw materials were mixed and stirred, and the obtained mixture was filtered through a nylon filter (manufactured by Pall Corporation) having a pore size of 0.45 μm to prepare a Blue composition 1.

| | |
|---|---|
| Blue Pigment Dispersion | 44.9 parts by mass |
| 40 mass % PGMEA solution of resin 1 | 2.1 parts by mass |
| Curable compound 1 | 1.5 parts by mass |
| Curable compound 3 | 0.7 parts by mass |
| Photoinitiator 2 | 0.8 parts by mass |
| 0.2 mass % PGMEA solution of surfactant 1 | 4.2 parts by mass |
| PGMEA | 45.8 parts by mass |

Raw materials used for the color filter-forming composition are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co, Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Red pigment dispersion was obtained.

Green Pigment Dispersions 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min.

This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Blue pigment dispersion was obtained.

Resin 1: the resin P1

Surfactant 1: the surfactant F1

Curable Compound 1: a compound having the following structure

Curable compound 3: ARONIX M-305 (manufactured by Toagosei Co., Ltd.)

Thotoinitiator 1: the photoinitiator I1
Thotoinitiator 2: the photoinitiator I2
Photoinitiator 3: the photoinitiator I3
Ultraviolet absorber 1: the ultraviolet absorber UV1

Manufacturing of Structure

Example 1

Using the following method, the structure illustrated in FIG. 1 was manufactured. A 1.1×1.1 μm island pattern (first near infrared transmitting filter, thickness: 1.5 μm) was formed on a silicon photodiode with a photolithography method using an IR transmitting composition 2-1. Next, a pixel of a 1.1×1.1 μm island bayer pattern (second near infrared transmitting filter, thickness: 1.5 μm) was formed on the silicon photodiode on which the first near infrared transmitting filter was formed with a photolithography method using an IR transmitting composition 3-1. As a

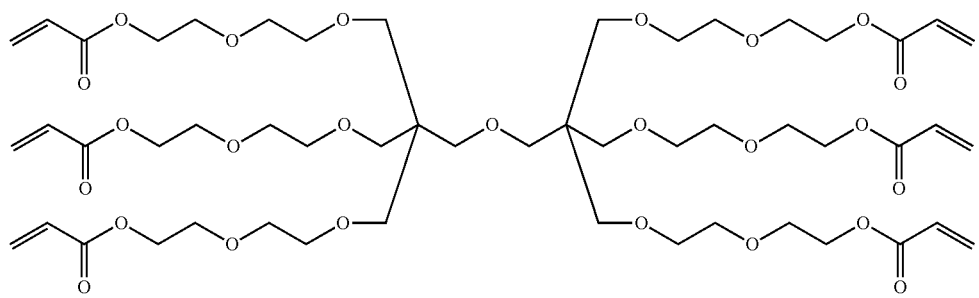 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Curable compound 2: a mixture of compounds having the following structures (a mixture in which a molar ratio between a left compound and a right compound is 7:3)

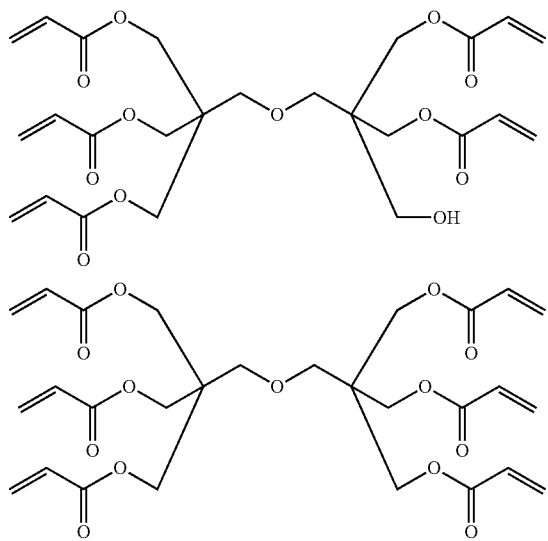

result, the structure illustrated in FIG. 1 was manufactured. A minimum value of a transmittance to light having a longer wavelength than longest wavelengths at which transmittances of the first near infrared transmitting filter and the second near infrared transmitting filter in a wavelength range of 600 to 1300 nm were 50% was 50% or higher.

In addition, in a wavelength range of 600 to 1300 nm, a wavelength (hereinafter, referred to as "λ50") of light at the longest wavelength at which the transmittance of the first near infrared transmitting filter was 50% was 790 nm, and λ50 of the second near infrared transmitting filter was 895 nm.

Examples 2 to 5 and Comparative Examples 1 to 4

A structure was manufactured using the same method as that of Example 1, except that an IR transmitting composition shown in the following table was used. A minimum value of a transmittance to light having a longer wavelength than longest wavelengths at which transmittances of the respective near infrared transmitting filters in a wavelength range of 600 to 13.00 nm were 50% was 50% or higher. In addition, the pixel sizes of the respective near infrared transmitting filters were 1.1×1.1 μm, and the thicknesses thereof were as shown in the following table.

TABLE 4

| | IR Transmitting Composition Used, Thickness | | |
|---|---|---|---|
| | First Near Infrared Transmitting Filter | Second Near Infrared Transmitting Filter | Third Near Infrared Transmitting Filter |
| Example 1 | IR Transmitting Composition 2-1 Thickness: 1.5 μm | IR Transmitting Composition 3-1 Thickness: 1.5 μm | — |
| Example 2 | IR Transmitting Composition 1-1 Thickness: 1.0 μm | IR Transmitting Composition 3-2 Thickness: 2.0 μm | — |
| Example 3 | IR Transmitting Composition 2-4 Thickness; 1.2 μm | IR Transmitting Composition 3-3 Thickness: 2.0 μm | — |
| Example 4 | IR Transmitting Composition 2-3 Thickness: 2.0 μm | IR Transmitting Composition 3-5 Thickness: 2.0 μm | — |
| Example 5 | IR Transmitting Composition 1-1 Thickness: 1.5 μm | IR Transmitting Composition 2-4 Thickness: 1.5 μm | IR Transmitting Composition 3-4 Thickness: 1.5 μm |
| Comparative Example 1 | IR Transmitting Composition 1-1 Thickness: 1.0 μm | — | — |
| Comparative Example 2 | IR Transmitting Composition 2-2 Thickness: 1.2 μm | — | — |
| Comparative Example 3 | IR Transmitting Composition 3-4 Thickness: 2.0 μm | — | — |
| Comparative Example 4 | IR Transmitting Composition 3-4 Thickness: 2.0 μm | IR Transmitting Composition 3-1 Thickness: 2.0 μm | — |

Example 6

Using the following method, the structure illustrated in FIG. 2 was manufactured. A 1.1×1.1 μm island bayer pattern (first near infrared transmitting filter, thickness: 1.8 μm) was formed on a silicon photodiode with a photolithography method using the IR transmitting composition 2-1. Next, a pixel of a 1.1×1.1 μm island bayer pattern (second near infrared transmitting filter, thickness: 1.8 μm) was formed on the silicon photodiode on which the first near infrared transmitting filter was formed with a photolithography method using the IR transmitting composition 3-1. Next, a 1.1×1.1 μm island bayer pattern (a near infrared cut filter formed of a laminate including a film of a IR absorbing composition 1 (thickness: 0.9 μm) and a film of a IR absorbing composition 2 (thickness: 0.9 μm)) was formed on the silicon photodiode on which the near infrared transmitting filters were formed with a photolithography method using the IR absorbing composition 1 and the IR absorbing composition 2. As a result, the structure illustrated in FIG. 2 was manufactured. A minimum value of a transmittance to light having a longer wavelength than longest wavelengths at which transmittances of the first near infrared transmitting filter and the second near infrared transmitting filter in a wavelength range of 600 to 1300 nm were 50% was 50% or higher.

Example 7

Using the following method, the structure illustrated in FIG. 4 was manufactured. A 1.1×1.1 μm island bayer pattern (first near infrared transmitting filter, thickness: 1.0 μm) was formed on a silicon photodiode with a photolithography method using an IR transmitting composition 2-3. Next, a pixel of a 1.1×1.1 μm island bayer pattern (second near infrared transmitting filter, thickness: 1.5 μm) was formed on the silicon photodiode on which the first near infrared transmitting filter was formed with a photolithography method using the IR transmitting composition 3-4. Next, a 1.1×1.1 μm island bayer pattern (red colored layer, thickness: 0.6 μm) was formed on the silicon photodiode on which the near infrared transmitting filters were formed with a photolithography method using the Red composition 1. By patterning the Green composition 1 and the Blue composition 1 using the same method as described above, a blue colored layer (thickness: 0.6 μm) and a green colored layer (thickness: 0.6 μm) were formed. As a result, the structure illustrated in FIG. 4 was manufactured. A minimum value of a transmittance to light having a longer wavelength than longest wavelengths at which transmittances of the first near infrared transmitting filter and the second near infrared transmitting filter in a wavelength range of 600 to 1300 nm were 50% was 50% or higher.

Example 8

Using the following Method, the structure illustrated in FIG. 2 was manufactured. A 1.1×1.1 μm island bayer pattern (first near infrared transmitting filter, thickness: 1.0 μm) was formed on a silicon photodiode with a photolithography method using an IR transmitting composition 1-1. Next, a pixel of a 1.1×1.1 μm island bayer pattern (second near infrared transmitting filter, thickness: 1.0 μm) was formed on the silicon photodiode on which the first near infrared transmitting filter was formed with a photolithography method using the IR transmitting composition 2-1. Next, a 1.1×1.1 μm island bayer pattern (near infrared cut filter, thickness: 1.0 μm) was formed on the silicon photodiode on which the near infrared transmitting filters were formed with a photolithography method using an IR absorbing composition 6. As a result, the structure illustrated in FIG. 2 was manufactured. A minimum value of a transmittance to light having a longer wavelength than longest wavelengths at which transmittances of the first near infrared transmitting filter and the second near infrared transmitting filter in a wavelength range of 600 to 1300 nm were 50% was 50% or higher.

Each of the structures was embedded into an optical sensor using a well-known method. Distance recognition was performed by emitting light having a wavelength shown in the following table to the structure from the light source. In this case, in the optical sensors into which the structures according to Examples 1 to 8 were embedded, the recognition accuracy was higher than that of the optical sensors into which the structures according to Comparative Examples 1 to 4 were embedded.

TABLE 5

| | Spectral Characteristics | | | |
|---|---|---|---|---|
| | λ50 of First Near Infrared Transmitting Filter | λ50 of Second Near Infrared Transmitting Filter | λ50 of Third Near Infrared Transmitting Filter | Light Source |
| Example 1 | 790 nm | 895 nm | — | 850 nm, 940 nm |
| Example 2 | 660 nm | 895 nm | — | 670 nm, 940 nm |
| Example 3 | 790 nm | 890 nm | — | 850 nm, 940 nm |
| Example 4 | 790 nm | 880 nm | — | 820 nm, 940 nm |
| Example 5 | 660 nm | 790 nm | 870 nm | 670 nm, 850 nm, 940 nm |
| Example 6 | 790 nm | 895 nm | — | 820 nm, 940 nm |
| Example 7 | 790 nm | 870 nm | — | 810 nm, 920 nm |
| Example 8 | 660 nm | 790 nm | — | 670 nm, 810 nm |
| Comparative Example 1 | 660 nm | — | — | 670 nm |
| Comparative Example 2 | 790 nm | — | — | 850 nm |
| Comparative Example 3 | 870 nm | — | — | 940 nm |
| Comparative Example 4 | 870 nm | 895 nm | — | 900 nm, 920 nm |

EXPLANATION OF REFERENCES

1: support
11: first near infrared transmitting filter
12: second near infrared transmitting filter
21 to 23: near infrared cut filter
30: color filter
31: red colored layer
32: blue colored layer
33: green colored layer
61 and 62: band pass filter
101 to 108: structure

What is claimed is:

1. A structure comprising:
a support; and
a first near infrared transmitting filter and a second near infrared transmitting filter that are provided at different positions on the support and allow transmission of at least a part of near infrared light,
wherein the first near infrared transmitting filter shields at least a part of visible light,
the second near infrared transmitting filter shields light up to a longer wavelength than a wavelength of the light shielded by the first near infrared transmitting filter,
a minimum value of a transmittance to light having a longer wavelength than a longest wavelength at which transmittances of the first near infrared transmitting filter and the second near infrared transmitting filter in a wavelength range of 600 to 1300 nm are 50% is 50% or higher, and
a difference between a wavelength $\lambda_2$ of light having the longest wavelength at which the transmittance of the second near infrared transmitting filter is 50% and a wavelength $\lambda_1$ of light having then longest wavelength at which the transmittance of the first near infrared transmitting filter is 50% in a wavelength range of 600 to 1300 nm is 30 nm or longer.

2. The structure according to claim 1, further comprising:
at least one of a color filter or a near infrared cut filter that is provided at a position different from the positions where the first near infrared transmitting filter and the second near infrared transmitting filter are provided on the support.

3. The structure according to claim 1, further comprising:
a band pass filter that is provided on an optical path of at least one of the first near infrared transmitting filter or the second near infrared transmitting filter and allows transmission of a part of near infrared light.

4. The structure according to claim 2, further comprising:
a band pass filter that is provided on an optical path of at least one of the first near infrared transmitting filter or the second near infrared transmitting filter and allows transmission of a part of near infrared light.

5. The structure according to claim 3,
wherein the band pass filter is a filter that allows transmission of light in a wavelength range of the wavelength $\lambda_1$ to the wavelength $\lambda_2$+50 nm.

6. The structure according to claim 4,
wherein the band pass filter is a filter that allows transmission of light in a wavelength range of the wavelength $\lambda_1$ to the wavelength $\lambda_2$+50 nm.

7. The structure according to claim 3,
wherein the band pass filter is a filter that allows, transmission of light in a wavelength range of 400 to 620 nm and light in a wavelength range of the wavelength $\lambda_1$ to the wavelength $\lambda_2$+50 nm.

8. The structure according to claim 4,
wherein the band pass filter is a filter that allows transmission of light in a wavelength range of 400 to 620 nm and light in a wavelength range of the wavelength $\lambda_1$ to the wavelength $\lambda_2$+50 nm.

9. The structure according to claim 5,
wherein the band pass filter is a filter that allows transmission of light in a wavelength range of 400 to 620 nm and light in a wavelength range of the wavelength $\lambda_1$ to the wavelength $\lambda_2$+50 nm.

10. The structure according to claim 6,
wherein the band pass filter is a filter that allows transmission of light in a wavelength range of 400 to 620 nm and light in a wavelength range of the wavelength $\lambda_1$ to the wavelength $\lambda_2$+50 nm.

11. A kit for forming the first near infrared transmitting filter and the second near infrared transmitting filter in the structure according to claim 1, the kit comprising:
   a first near infrared transmitting filter-forming composition that includes a light shielding material and a curable compound; and
   a second near infrared transmitting filter-forming composition that includes a light shielding material and a curable compound.

12. An optical sensor comprising:
   the structure according to claim 1.

13. The optical sensor according to claim 12, further comprising:
   a light source that emits two or more light components having different wavelengths.

14. The optical sensor according to claim 12, further comprising:
   two or more light sources,
   wherein light components having different wavelengths are emitted from the respective light sources.

15. The optical sensor according to claim 13, further comprising:
   two or more light sources,
   wherein light components having different wavelengths are emitted from the respective light sources.

16. The optical sensor according to claim 13,
wherein the light components having different wavelength includes at least;
   light having a wavelength at which transmittances of the first near infrared transmitting filter and the second near infrared transmitting filter in the structure are 50% or higher and
   light having a wavelength at which a transmittance of the first near infrared transmitting filter is 50% or higher and a transmittance of the second near infrared transmitting filter is 20% or lower.

17. The optical sensor according to claim 14,
wherein the light components having different wavelength includes at least;
   light having a wavelength at which transmittances of the first near infrared transmitting filter and the second near infrared transmitting filter in the structure are 50% or higher and
   light having a wavelength at which a transmittance of the first near infrared transmitting filter is 50% or higher and a transmittance of the second near infrared transmitting filter is 20% or lower.

18. The optical sensor according to claim 15,
wherein the light components having different wavelength includes at least;
   light having a wavelength at which transmittances of the first near infrared transmitting filter and the second near infrared transmitting filter in the structure are 50% or higher and
   light having a wavelength at which a transmittance of the first near infrared transmitting filter is 50% or higher and a transmittance of the second near infrared transmitting filter is 20% or lower.

\* \* \* \* \*